United States Patent
Okada et al.

(10) Patent No.: US 10,211,490 B2
(45) Date of Patent: Feb. 19, 2019

(54) STORAGE BATTERY DETERIORATION MEASUREMENT DEVICE AND POWER STORAGE SYSTEM

(71) Applicant: MITSUBISHI ELECTRIC CORPORATION, Chiyoda-ku (JP)

(72) Inventors: Yuruki Okada, Chiyoda-ku (JP); Sho Shiraga, Tokyo (JP); Toshihiro Wada, Chiyoda-ku (JP); Shoji Yoshioka, Chiyoda-ku (JP)

(73) Assignee: MITSUBISHI ELECTRIC CORPORATION, Chiyoda-ku, Tokyo (JP)

(*) Notice: Subject to any disclaimer, the term of this patent is extended or adjusted under 35 U.S.C. 154(b) by 78 days.

(21) Appl. No.: 15/302,082

(22) PCT Filed: Apr. 9, 2014

(86) PCT No.: PCT/JP2014/002051
§ 371 (c)(1),
(2) Date: Oct. 5, 2016

(87) PCT Pub. No.: WO2015/155805
PCT Pub. Date: Oct. 15, 2015

(65) Prior Publication Data
US 2017/0125856 A1    May 4, 2017

(51) Int. Cl.
*H01M 10/48* (2006.01)
*H02J 7/00* (2006.01)
(Continued)

(52) U.S. Cl.
CPC ...... *H01M 10/482* (2013.01); *G01R 31/3679* (2013.01); *H01M 10/425* (2013.01);
(Continued)

(58) Field of Classification Search
CPC ............. H01M 10/482; H01M 10/425; H01M 10/4285; H01M 10/486; H01M 2010/4271; G01R 31/3679
See application file for complete search history.

(56) References Cited

U.S. PATENT DOCUMENTS

| 8,085,051 B2 | 12/2011 | Iida |
| 2003/0052646 A1* | 3/2003 | Minanniura .......... B60L 3/0023 320/122 |

(Continued)

FOREIGN PATENT DOCUMENTS

| EP | 2 088 445 A1 | 8/2009 |
| JP | 11-52033 A | 2/1999 |

(Continued)

OTHER PUBLICATIONS

International Search Report (PCT/ISA/210) dated Jul. 8, 2014, by the Japanese Patent Office as the International Searching Authority for International Application No. PCT/JP2014/002051.
(Continued)

*Primary Examiner* — Raymond Alejandro
(74) *Attorney, Agent, or Firm* — Buchanan Ingersoll & Rooney PC

(57) ABSTRACT

A storage battery deterioration measurement device and a power storage system are provided which measure deterioration in unit batteries included in an assembled battery constituting a storage battery in a shorter time than conventional devices and systems, and which include a control unit to acquire information based on the states of the multiple unit batteries and a deterioration determination unit to detect the unit battery indicating the maximum value among the information acquired by the control unit and the unit battery indicating the minimum value thereamong, and to detect deterioration in the unit batteries on the basis of the difference between a per-predetermined-period variation of infor-
(Continued)

mation on the unit battery indicating the maximum value and a per-predetermined-period variation of information on the unit battery indicating the minimum value.

5 Claims, 25 Drawing Sheets

(51) Int. Cl.
 *G01R 31/36* (2006.01)
 *H01M 10/42* (2006.01)
(52) U.S. Cl.
 CPC ....... *H01M 10/4285* (2013.01); *H01M 10/48* (2013.01); *H01M 10/486* (2013.01); *H02J 7/00* (2013.01); *H01M 2010/4271* (2013.01)

(56) References Cited

U.S. PATENT DOCUMENTS

| | | |
|---|---|---|
| 2010/0057385 A1 | 3/2010 | Iida |
| 2010/0253149 A1 | 10/2010 | Iida et al. |
| 2013/0314095 A1 | 11/2013 | Nakashima et al. |

FOREIGN PATENT DOCUMENTS

| | | |
|---|---|---|
| JP | 3543662 B2 | 7/2004 |
| JP | 2007-17357 A | 1/2007 |
| JP | 2007-311255 A | 11/2007 |
| JP | 2008-134060 A | 6/2008 |
| JP | 2008-192633 A | 8/2008 |
| JP | 2012-13472 A | 1/2012 |
| JP | 2013-118757 A | 6/2013 |
| WO | WO 2010/010662 A1 | 1/2010 |
| WO | WO 2013/002202 A1 | 1/2013 |

OTHER PUBLICATIONS

Office Action (Examination report No. 1 for standard patent application) dated Oct. 3, 2017, by the Australian Patent Office in corresponding Australian Patent Application No. 2014390724. (2 pages).

The partial supplementary European Search Report dated Oct. 30, 2017, by the European Patent Office in corresponding European Patent Application No. 14889022.1-1360 (13 pages).

* cited by examiner

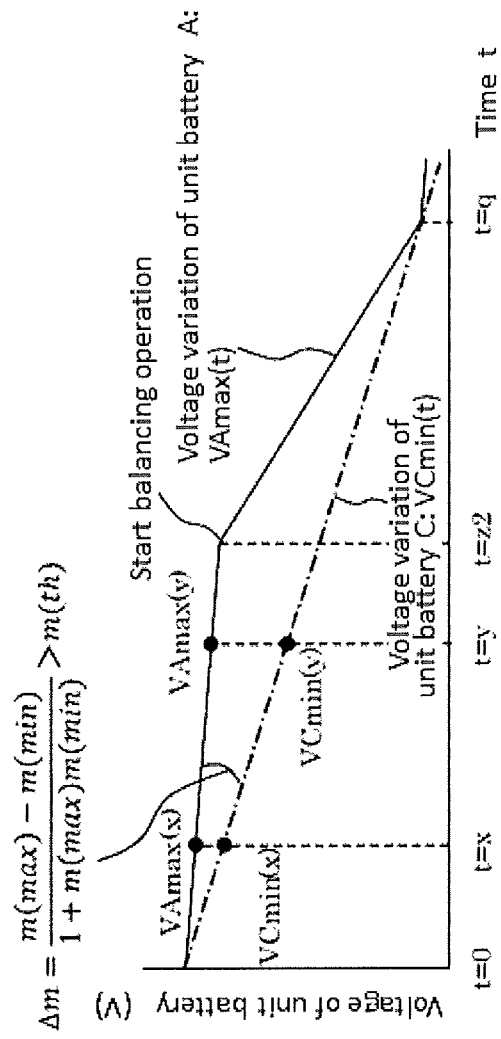

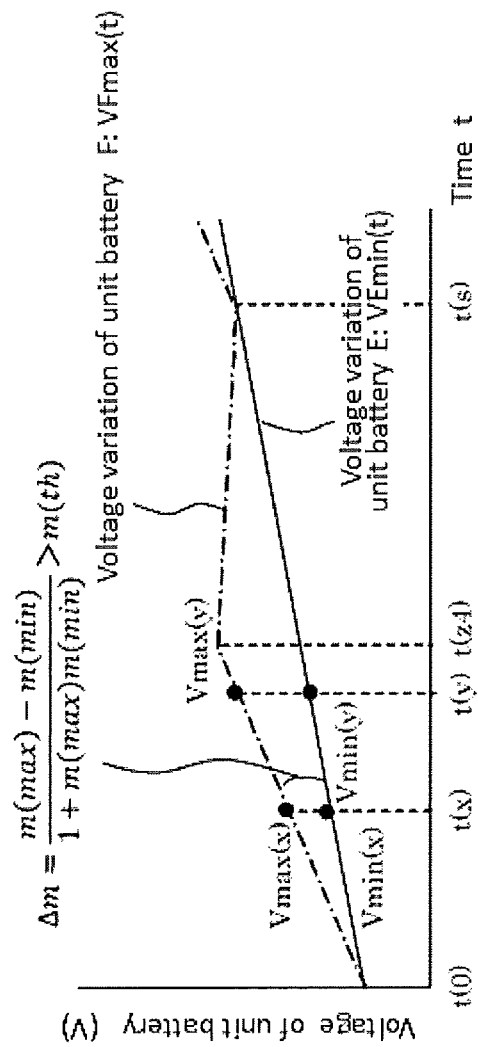

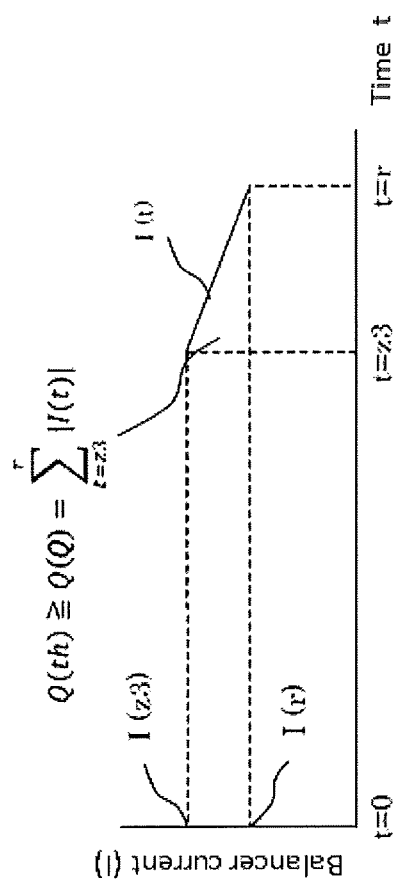

STORAGE BATTERY DETERIORATION MEASUREMENT DEVICE AND POWER STORAGE SYSTEM

TECHNICAL FIELD

The present invention relates to a power storage device deterioration measurement device which detects deterioration of a power storage device and a power storage system which includes the power storage device deterioration measurement device.

BACKGROUND

As a conventional technology, a method has been proposed that determines a deterioration state of an assembled battery by detecting the maximum and the minimum discharge voltages of each unit battery constituting the assembled battery at a setup time, calculating the difference between the maximum and the minimum values, and comparing the difference with a threshold. (for example, refer to Patent Document 1)

Also, for a power storage device in which equalization processing is conducted in order to control deterioration in a product life time of the storage batteries, a method has been proposed that determines, when an interval between equalization processing is equal to or shorter than a predetermined value, that the power storage device has an indication of abnormality and determines, when the total charge and discharge capacity of the power storage device determined as that having an indication of abnormality is equal to or larger than a reference value, that the power storage device has transitioned from "an almost abnormal state" to "a completely abnormal state". (for example, refer to Patent Document 2)

PRIOR ART DOCUMENT

Patent Document

Patent Document 1
Japanese Patent Laid-Open Publication No. 2007-311255 (from the 50th line of the Page 3 to the 4th line of the Page 4, FIG. 4)
Patent Document 2
Japanese Patent Laid-Open Publication No. 2008-134060 (from the 33rd to the 35th line of the Page 12, from the 20th to the 21st line of the Page 13)

SUMMARY OF THE INVENTION

Problems to be Solved by the Invention

However, there has been a problem with the determination method of an assembled battery described in Patent Document 1 that it takes a longer time, depending on the setting of the setup time, to measure deterioration of an assembled battery because the determination of deterioration will not be conducted until the setup time.

Also, there has been a problem with the determination method of a power storage device described in Patent Document 2 that it takes a longer time to measure deterioration of a power storage device because two steps of determination are required: first to determine whether or not the power storage device has an indication of abnormality, and then to determine, in a case of the indication found, whether or not a transition from "an almost abnormal state" to "a completely abnormal state" has occurred.

The present invention is made to solve the problem described above, and can shorten the time for measuring (determining) deterioration states of unit batteries than conventional devices because, from the information on the states of unit batteries constituting an assembled battery, the unit battery indicating the maximum value and the unit battery indicating the minimum value are detected, and it is determined that there exists a deteriorated unit battery when the difference between the per-predetermined-period variation in the information on the state of the unit battery indicating the maximum value and the per-predetermined-period variation in the information on the state of the unit battery indicating the minimum value is larger than a predetermined value.

Means for Solving the Problems

A storage battery deterioration measurement device according to the present invention includes a control unit to acquire information on states of multiple unit batteries, and a deterioration determination unit to have a predetermined value set in advance, to detect a unit battery indicating the maximum value among the information on the states of the multiple unit batteries acquired by the control unit, and a unit battery indicating the minimum value thereamong, and to determine, when the difference between a per-predetermined-period variation of the information on the state of the unit battery indicating the maximum value and a per-predetermined-period variation of information on the state of the unit battery indicating the minimum value is larger than the predetermined value, that there exists a deteriorated unit battery.

Effect of the Invention

A storage battery deterioration measurement device according to the present invention can shorten the time required for measuring a deterioration state of a unit battery than conventional devices.

BRIEF DESCRIPTION OF THE DRAWINGS

FIG. 3B shows how the voltages of unit batteries decrease with the lapse of time in a discharging state in Embodiment 1 of the present invention.

FIG. 5B shows how the voltages of the unit batteries increase with the lapse of time in a charging state in Embodiment 1 of the present invention.

FIG. 10B shows accumulations of the balancer currents in a charging state in Embodiment 2 of the present invention.

EMBODIMENTS FOR CARRYING OUT THE INVENTION

Embodiment 1

Figure 1:
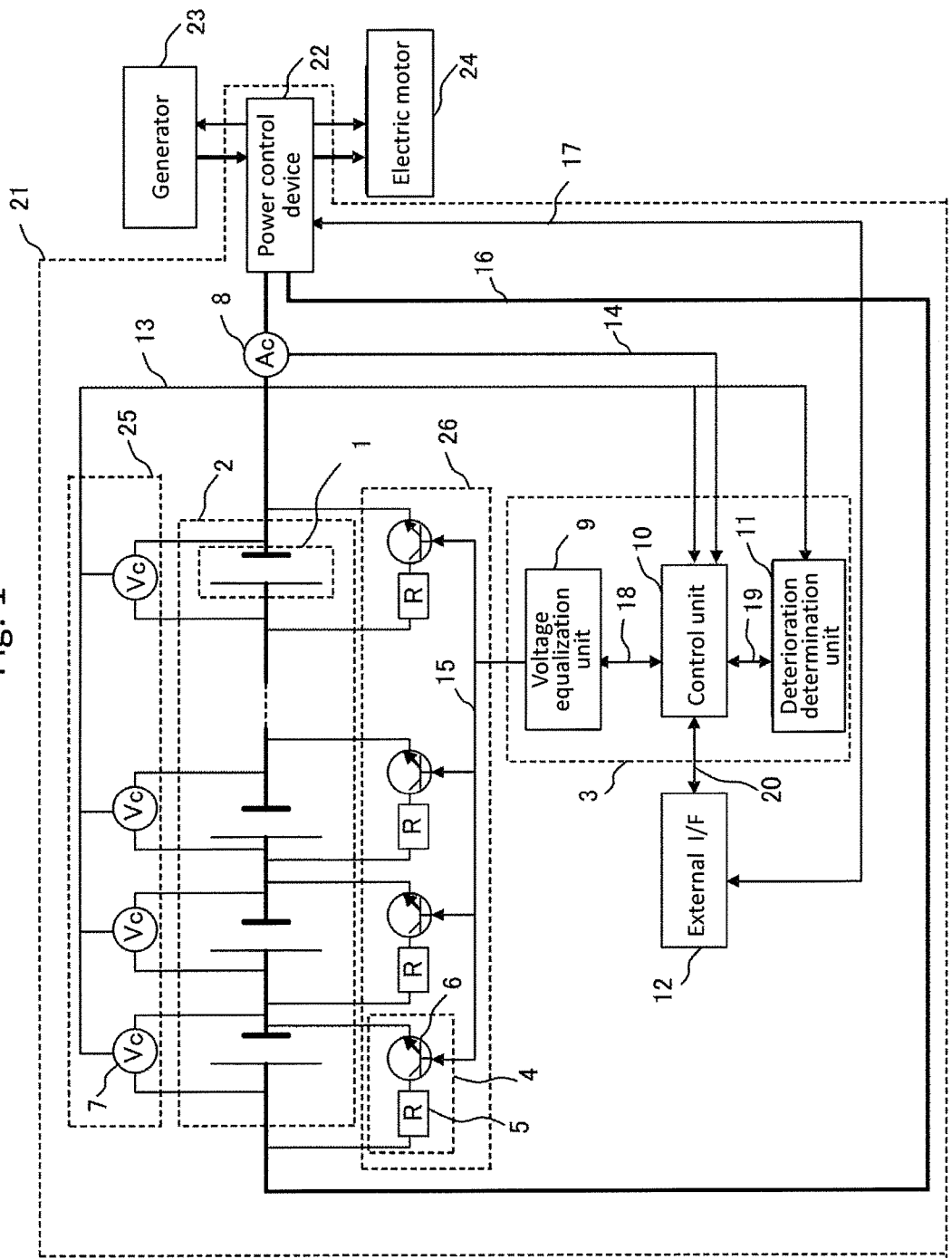
FIG. 1 shows a storage battery deterioration measurement device and a power storage system according to Embodiment 1 of the present invention.

FIG. 1 shows a storage battery deterioration measurement device and a power storage system according to Embodiment 1 of the present invention. In explanation of Embodiment 1, it is supposed that information on states of multiple unit batteries is voltages of the unit batteries. As shown in FIG. 1, a power storage system 21 includes a power control device 22, an assembled battery 2, a voltage detection unit 25, a balancing unit 26, a storage battery deterioration measurement device 3 and an external I/F 12. Between the assembled battery 2 and the power control device 22 is connected a current detector 8.

The power control device 22 provides an externally connected electric motor 24 with power acquired from the assembled battery 2. The power control device 22 also can provide the electric motor 24 with power acquired from a generator 23. Which to use either the assembled battery 2 or the generator 23 as a power supply source is selectable. The power control device 22 also can control the generator 23 and the electric motor 24. The assembled battery 2 includes multiple unit batteries (cell batteries) 1 and unit batteries 1 are electrically connected in series with each other. Note that, in this description, a unit battery 1 and an assembled battery 2 are included in a storage battery.

The voltage detection unit 25 includes a plurality of voltage detectors 7. The voltage detectors 7 are connected in parallel to the respective multiple unit batteries so as to correspond one-to-one thereto. The voltages of the unit batteries 1 are detected by the respective voltage detectors 7 connected in parallel thereto. The balancing unit 26 includes a plurality of balancing circuits 4. The balancing circuits 4 are connected in parallel to the respective multiple unit batteries 1 so as to correspond one-to-one thereto. The balancing circuit 4 includes a balancing resistor 5 and a switching element 6 connected in series.

The balancing circuit 4 is a circuit to decrease the voltage of the unit battery 1, which conducts a so-called balancing operation. In the balancing operation, when the switching element 6 is on, current flows through the balancing resistor 5 and power is consumed. Because power is consumed in the balancing resistor 5, the voltage of the unit battery 1 decreases and the voltage variations among multiple unit batteries 1 can be equalized. This operation is called a balancing operation. By suitably conducting the balancing operation in a charging or a discharging state of the assembled battery 2, the voltage variations among multiple unit batteries 1 can be eliminated and the voltages of all unit batteries 1 constituting the assembled battery can be equalized. The control and the detail of the balancing operation will be explained later.

The storage battery deterioration measurement device 3 includes a voltage equalization unit 9, a control unit 10 and a deterioration determination unit 11. The voltage equalization unit 9 and the control unit 10 are connected via a circuit 18 so that information can be transmitted and received. The control unit 10, for example, controls the voltage equalization unit 9 to conduct balancing operation. The control unit 10 and the deterioration determination unit 11 are also connected via a circuit 19 so that information can be transmitted and received. The deterioration determination unit 11, for example, can transmit information on the deterioration of the unit batteries 1 to the control unit 10.

Each of the control unit 10 and the deterioration determination unit 11 is connected with the multiple voltage detectors 7 via a circuit 13. The voltages detected by the voltage detectors 7 are transmitted to the control unit 10 and the deterioration determination unit 11. The control unit 10 is connected with the current detector 8 via a circuit 14. The current detected by the current detector 8 is transmitted to the control unit 10. Note that the control unit 10 and the deterioration determination unit 11 may acquire the voltages detected by the voltage detector 7 instead of having the voltages transmitted from the voltage detectors 7. Also the control unit 10 may acquire the voltages from the current detector 8 via the circuit 14.

The voltage equalization unit 9 is connected with each of the switching elements 6 in the respective balancing circuits 4 via a circuit 15 so that the voltage equalization unit 9 can switch on and off the plurality of switching elements 6.

The external I/F 12 is an external equipment connection interface such as an USB device, with which an external device is connected. The external I/F 12 is connected to the control unit 10 via a circuit 20 and can output states of the assembled battery 2 and the unit batteries 1 to an external device (not illustrated) such as a display. The external I/F 12 is connected with the power control device 22 via a circuit 17 and the power control device 22 controls the generator 23 or the electric motor 24 on the basis of the information of the control unit 10 acquired via the external I/F 12. In addition, in FIG. 1, a circuit 16 shown as a bold line connects the power control device 22, the current detector 8 and the assembled battery 2. The bold line also schematically illustrates a power transfer path. An arrow directing from the generator 23 to the power control device 22 and an arrow directing from the power control device 22 to the electric motor 24 also illustrate power transfer paths.

Figure 2:
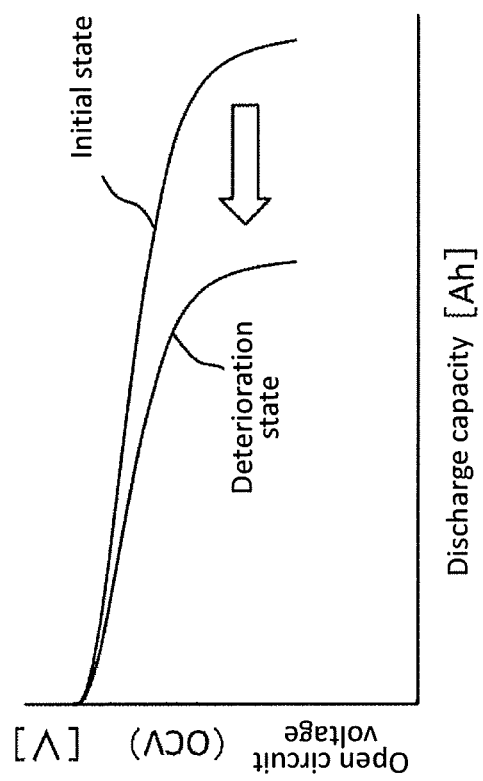
FIG. 2 shows how the open circuit voltage curve varies as a unit battery deteriorates.

Next, deterioration features of the unit battery 1 will be explained. FIG. 2 shows the relation between the discharge capacity and the open circuit voltage (OCV) in an initial state of the unit battery 1, and the relation between the discharge capacity and the open circuit voltage (OCV) in a state in which the battery is deteriorated. As shown in FIG. 2, the discharge capacity relates to the open circuit voltage (OCV) so that the larger the discharge capacity of the battery is, the smaller the open circuit voltage is. A graph depicting a discharge capacity and an open circuit voltage (OCV), as shown in FIG. 2, is called an open circuit voltage curve.

The open circuit voltage curve changes depending on the deterioration state of a battery. When a battery is deteriorated, as shown by the arrow in FIG. 2, the open circuit voltage curve shrinks in a discharge capacity direction with its open circuit voltage kept unchanged at the point where the discharge capacity is zero. Therefore, when a battery deteriorates, a voltage variation becomes larger within a same energization time. More specifically, a deteriorated battery tends to have a lower open circuit voltage than the one not deteriorated even when they have a same discharge capacity.

(When Discharging)

FIG. 3 shows how the voltages of the unit batteries 1 decrease with the lapse of time in a discharging state. The unit batteries 1 have individual differences in manufacturing, so the voltage decreases of the unit batteries 1 vary depending on the unit batteries 1. In order to stabilize the output voltage of the assembled battery 2, it is desirable to equalize the voltages of all the unit batteries 1 constituting the assembled battery 2.

In a case where batteries are repeatedly charged and discharged, for example, some unit batteries 1 deteriorate and others do not even when the same number of charging and discharging are conducted to them. Because the assembled battery 2 uses multiple unit batteries 1, if any one of the unit batteries 1 deteriorates, the performance of the assembled battery 2 deteriorates. Therefore, if any one of the multiple unit batteries 1 constituting the assembled battery 2 deteriorates, such deterioration has to be measured (detected) in an early stage.

Figure 3A:
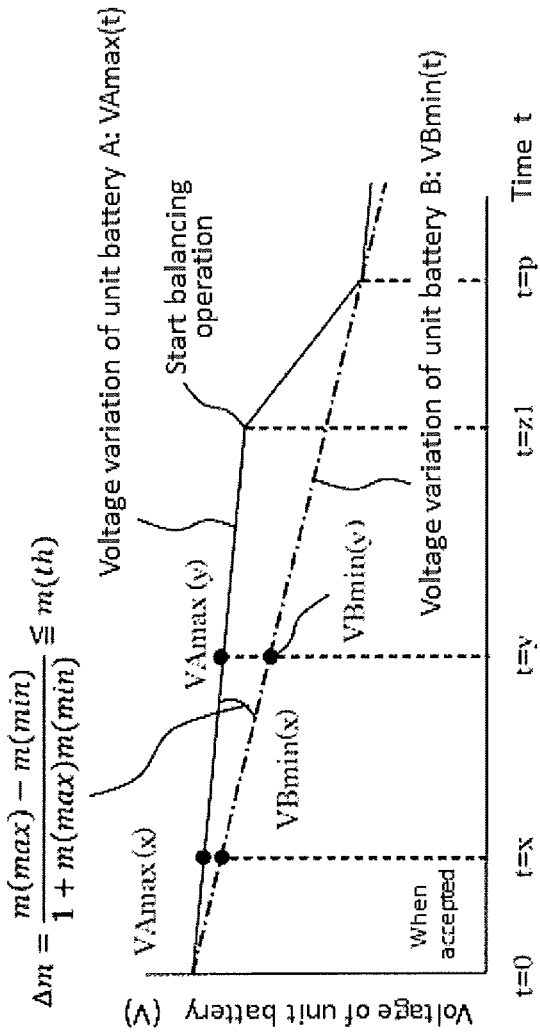
FIG. 3A shows how the voltages of unit batteries decrease with the lapse of time in a discharging state in Embodiment 1 of the present invention.

As shown in FIG. 3, when discharging, the voltages of the unit batteries 1 decrease as time elapses. Among the multiple unit batteries 1 constituting the assembled battery 2, FIG. 3(a) shows VAmax(t) denoting a voltage varying over time of the unit battery A indicating the maximum voltage and VBmin(t) denoting a voltage varying over time of the unit battery B indicating the minimum voltage.

As shown in FIG. 3(a), the voltage difference between the unit battery A and the unit battery B is approximately 0 at the time t=0. As discharge time elapses, the voltage decrease of the unit battery B becomes larger than that of the unit battery A. At the time t=z1, when the difference between the voltage of the unit battery A indicating the maximum voltage and the voltage of the unit battery B indicating the minimum voltage reaches a predetermined value, the control unit 10 controls an equalization unit 9 to operate the balancing circuit 4 connected with the unit battery A. The balancing operation, which starts decreasing the voltage of the unit battery A at the time t=z1, equalizes the voltages of the unit battery A and the unit battery B at the time t=p. By the balancing operation, the voltage variations of the unit batteries 1 can be controlled.

Next, as shown in FIG. 3(b), explanation will be made on a case where a unit battery C exists whose voltage decrease per unit time is larger than the unit battery B shown in FIG. 3(a). As shown in FIG. 3(b), the voltage difference between the unit battery A and the unit battery C is approximately 0 at the time=0. Because the per-unit-time voltage decrease of the battery C is larger than the per-unit-time voltage decrease of the unit battery B, the balancing operation starts at the time t=z2 which is earlier than the time t=z1.

A time (q-z2) required for the balancing operation shown in FIG. 3(b) is longer than a time (p-z1) required for balancing operation shown in FIG. 3(a). That is to say, a voltage balancing operation to a unit battery 1 such as the unit battery C takes a longer time than that to the unit battery B. Therefore, for operation and maintenance of the assembled battery 2, the method is inadequate in which determination is made, as described in Patent Document 2, that there is an indication of abnormality occurrence with a power storage device when the interval between equalization processing is equal to or shorter than a predetermined value.

Therefore, in the storage battery deterioration measurement device 3 and the power storage system 21 according to Embodiment 1, a method is used in which, before staring a balancing operation, determination is made that a deteriorated battery exists among the unit batteries 1 constituting the assembled battery 2 when the difference between a per-predetermined-period voltage variation of the unit battery 1 indicating the maximum voltage and the a per-predetermined-period voltage variation of the unit battery 1 indicating the minimum voltage is larger than a predetermined value. Note that the determination of the difference between the variations is conducted by the deterioration determination unit 11 shown in the FIG. 1.

Here, the per-predetermined-period voltage variation of the unit battery 1 in a discharging state will be explained. As shown in FIG. 3, the time t=x and the time t=y are set between the time t=0 and the time t=z1 when the balancing operation starts. The time t=y is set to be later than the time t=x.

When the difference between the voltage of the unit battery 1 indicating the maximum voltage among the unit batteries 1 constituting the assembled battery 2 and the voltage of the unit battery 1 indicating the minimum voltage thereamong becomes larger than a predetermined value, the control unit 10 controls the voltage equalization unit 9 to start the balancing operation. Therefore, the time t=x and the time t=y needs to be set before the difference becomes larger than the predetermined value. For example, the time t=x and the time t=y can be set by arbitrarily choosing two points of time out of a plurality of points of time at which the voltages of the unit batteries 1 are acquired in a condition that the difference between the voltage of the unit battery 1 indicating the maximum voltage and the voltage of the unit battery 1 indicating the minimum voltage among the unit batteries 1 constituting the assembled battery 2 is equal to or smaller than a predetermined value.

If the feature of the unit battery 1 is known in advance, and when the time slot to conduct the balancing operation is determined beforehand, it suffices that the time t=x and the time t=y are set to be earlier than the point of time predetermined in the deterioration determination unit 11. Thus, a per-predetermined-period voltage variation of the unit battery 1 can be calculated before the balancing operation is conducted. In later Embodiments, the same method is supposed to be used for determining the time t=x and the time t=y.

The time t=y and the time t=x shown in FIG. 3(b) may be the same as or different from the time t=x and the time t=y which are defined in FIG. 3(a) and can be appropriately changed in accordance with the charging feature and the discharging feature of the assembled battery 2.

In FIG. 3(a), let the slope of the voltage variation of the unit battery A from the time t=x to the time t=y be m(max). Let the slope of the voltage variation of the unit battery B from the time t=x to the time t=y be m(min). In other words, the per-predetermined-period voltage variation of the unit battery 1 indicating the maximum voltage is represented by m(max) and the per-predetermined-period voltage variation of the unit battery 1 indicating the minimum voltage is represented by m(min).

Note here that m(max) and m(min) satisfy the following equations.

$$m(\max) = \frac{VA\max(y) - VA\max(x)}{y - x} \quad \text{[Equation 1]}$$

$$m(\min) = \frac{VB\min(y) - VB\min(x)}{y - x} \quad \text{[Equation 2]}$$

Here, a difference $\Delta m$ between voltage variations will be defined. If the difference $\Delta m$ between variations is defined as a value based on an angle formed by the slope m(max) and the slope m(min), $\Delta m$ is given by the following equation.

$$\Delta m = \frac{m(\max) - m(\min)}{1 + m(\max)m(\min)} \quad \text{[Equation 3]}$$

Here, when the difference $\Delta m$ between variations is larger than a predetermined value m(th), it is determined that the unit battery 1 indicating the minimum voltage is deteriorated. In a case, as shown in FIG. 3(a), where the difference $\Delta m$ between m(max) denoting the per-predetermined-period voltage variation of the unit battery A indicating the maximum voltage and m(min) denoting the per-predetermined-period voltage variation of the unit battery B indicating the minimum voltage is represented as $\Delta m \leq m(th)$, the deterioration measurement is not conducted. Note that a per-unit-time voltage variation difference $\Delta m$ between a deteriorated unit battery 1 and a normal unit battery 1 can be measured to be stored in advance as the predetermined value m(th) in the deterioration determination unit 11. For example, the variation difference $\Delta m$ can be stored, in advance, in a table prepared in the deterioration determination unit 11.

On the other hand, in a case as shown in FIG. 3(b) where a voltage varying over time of the unit battery C indicating the minimum voltage is represented as VCmin(t), when the difference $\Delta m$ between m(max) denoting the per-predetermined-period voltage variation of the unit battery A indicating the maximum voltage and m(min) denoting the per-predetermined-period voltage variation of the unit battery C indicating the minimum voltage satisfies the relation $\Delta m > m(th)$, the deterioration measurement is conducted, and then it is determined that the unit battery C indicating the minimum voltage is deteriorated.

However, it is assumed that m(min) in a case as shown in FIG. 3(b) satisfies the following relation.

$$m(\min) = \frac{VC\min(y) - VC\min(x)}{y - x} \quad \text{[Equation 4]}$$

Next, referring to FIG. 1, explanation will be made about operation in the configuration shown in FIG. 1 which detects a deteriorated unit battery 1 in a discharging state of the assembled battery 2. The control unit 10 shown FIG. 1 acquires voltages of the unit batteries 1 included in the assembled battery 2. Regarding the timing when the control unit 10 acquires the voltages of the multiple unit batteries 1, the control unit 10 may periodically acquire the voltage of each of the unit batteries 1, or may simultaneously acquire the voltages of all the unit batteries 1 at a predetermined timing, for example, every a few hours in a day.

Referring to the voltages of the unit batteries 1 acquired by the control unit 10 from the voltage detectors 7 via the circuit 13, the deterioration determination unit 11 detects the unit battery 1 indicating the maximum voltage and the unit battery 1 indicating the minimum voltage among the multiple unit batteries 1. When the difference $\Delta m$ between m(max) denoting the per-predetermined-period voltage variation of the unit battery 1 indicating the maximum voltage and m(min) denoting the per-predetermined-period voltage variation of the unit battery 1 indicating the minimum voltage is larger than the predetermined value m(th), the deterioration determination unit 11 determines that the unit battery 1 indicating the minimum voltage is deteriorated.

Figure 4:
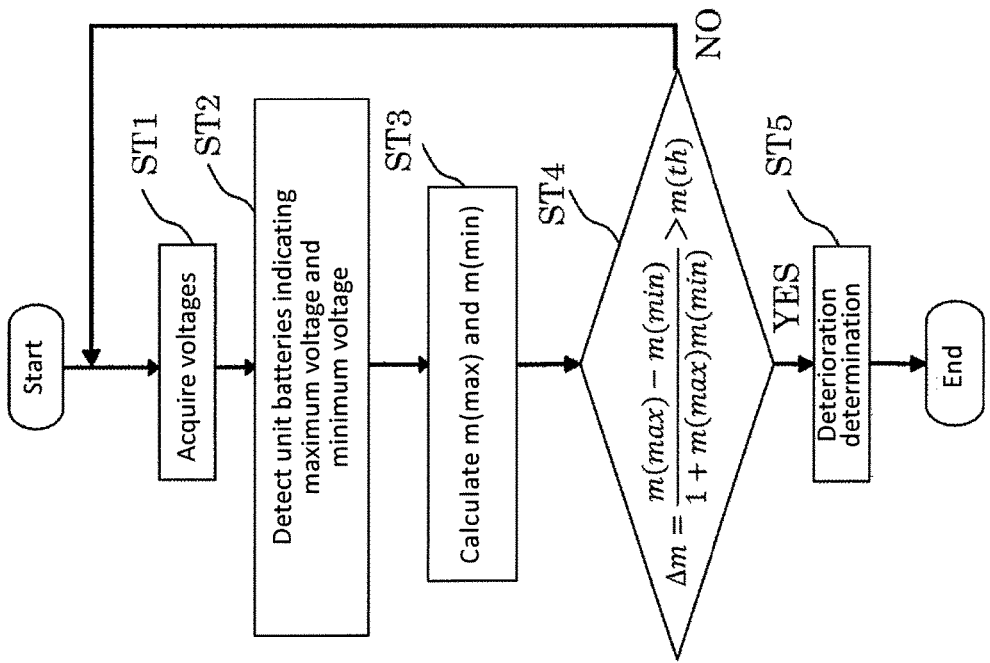
FIG. 4 shows a flowchart according to Embodiment 1 of the present invention, for determining deterioration in a discharging state.

Next, explanation will be made about a flowchart which shows a procedure for the deterioration determination when the assembled battery 2 is in a discharging state. FIG. 4 shows the deterioration determination procedure conducted by the storage battery deterioration measurement device 3 when the unit batteries 1 included in the assembled battery 2 are in a discharging state. When the storage battery deterioration measurement device 3 starts the deterioration determination procedure, voltages of the multiple unit batteries 1 included in the assembled battery 2 are acquired by the control unit 10 (ST1).

The deterioration determination unit 11 refers to the voltages of the unit batteries 1 acquired by the control unit 10 to detect the unit battery 1 indicating the maximum voltage and the unit battery 1 indicating the minimum voltage among the unit batteries 1 included in the assembled battery 2 (ST2). The deterioration determination unit 11 calculates m(max) denoting the per-predetermined-period voltage variation of the unit battery 1 indicating the maximum voltage and m(min) denoting the per-predetermined-period voltage variation of the unit battery 1 indicating the minimum voltage (ST3), and then compares $\Delta m$ denoting a variation difference between m(max) and m(min) with a predetermined value m(th) (ST4).

When $\Delta m$ is larger than the predetermined value m(th), the deterioration determination unit 11 determines that there exists a deteriorated unit battery 1 (ST5), thereby ending the procedure. When $\Delta m$ is equal to or smaller than the predetermined value m(th), the deterioration determination unit 11 repeats steps after the step ST1 where voltages of the multiple unit batteries 1 included in the assembled battery 2 are acquired by the control unit 10.

(When Charging)

Next, explanation will be made about how to measure deterioration in the unit batteries 1 when the assembled battery 2 is in a charging state. FIG. 5 shows how the voltages of the unit batteries 1 increase with the lapse of time in a charging state. As described above, the unit batteries 1 have individual differences (in voltage) in manufacturing, so the voltage increase of the unit batteries 1 in a charging state vary depending on the unit batteries 1. In order to stabilize the output voltage of the assembled battery 2, it is desirable to equalize the charging states of the multiple unit batteries 1 constituting the assembled battery 2.

Figure 5A:
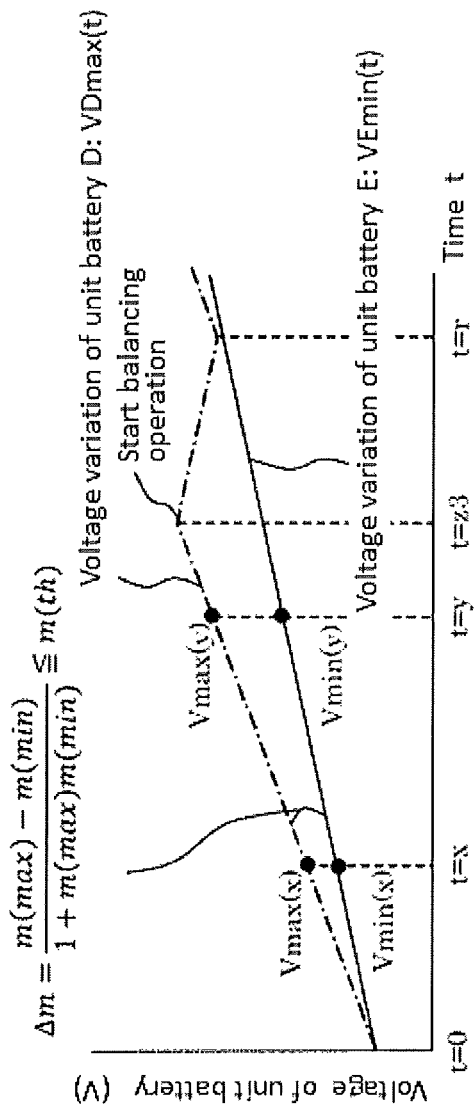
FIG. 5A shows how the voltages of the unit batteries increase with the lapse of time in a charging state in Embodiment 1 of the present invention.

As shown in FIG. 5, when charging the assembled battery 2, the voltage of each unit battery 1 increases as time elapses. Among the multiple unit batteries 1 constituting the assembled battery 2, FIG. 5(a) shows VDmax(t) denoting a voltage varying over time of the unit battery D indicating the maximum voltage and VEmin(t) denoting a voltage varying over time of the unit battery E indicating the minimum voltage.

As shown in FIG. 5(a), the voltage difference between the unit battery D and the unit battery E is approximately 0 at the time t=0. As the charging time elapses, the voltage increase of the unit battery D becomes larger than the voltage increase of the unit battery E. At a time t=z3 when the difference between the voltage of the unit battery D indicating the maximum voltage and the voltage of the unit battery E indicating the minimum voltage reaches a predetermined value, the balancing circuit 4 connected with the unit battery D is operated. The balancing operation to the unit battery D started at the time t=z3 decreases the voltage of the unit battery D so that the voltages of the unit battery D and the unit battery E become equal at a time t=r.

In contrast, explanation will be made on the case where a unit battery F exists, whose per-unit-time voltage increase is larger, as shown in FIG. 5(b), than that of the unit battery D shown in FIG. 5(a). When time t=0 in FIG. 5(b), the voltage difference between the unit battery D and the unit battery F is approximately 0. Because the per-unit-time voltage increase of the unit battery F is larger than the per-unit-time voltage increase of the unit battery E, the control unit 10 controls, at the time t=z4 which is earlier than the time t=z3, the voltage equalization unit 9 to conduct the balancing operation.

A time (s-z4) shown in FIG. 5(b) required for the balancing operation is longer than a time (r-z3) shown in FIG. 5(a) required for the balancing operation. Thus, in a unit battery 1 shown as the unit battery F, it takes a longer time to balance voltages. Therefore, for operation and maintenance of the assembled battery 2, a method is inadequate in which determination is made, as described in Patent Document 2, that there is an indication of abnormality occurrence in a power storage device when the interval between equalizations is equal to or shorter than a predetermined value.

Therefore, in the storage battery deterioration measurement device 3 and the power storage system 21 in the present embodiment, a method is used in which, before a balancing operation starts, the deterioration determination unit 11 determines that a deteriorated battery exists when the difference between the per-predetermined-period voltage variation of the unit battery 1 indicating the maximum voltage among the unit batteries 1 constituting the assembled battery 2 and the per-predetermined-period voltage variation of the unit battery 1 indicating the minimum voltage thereamong is larger than a predetermined value.

Here, a per-predetermined-period variation of the unit battery 1 in a charging state will be explained. As shown in FIG. 5(a), the deterioration determination unit 11 sets the time t=x and the time t=y between the time t=0 and the time t=z3 when the balancing operation starts. Note that the time t=y is later than the time t=x. Also these times may be the same as or different from the times t=x and t=y having been defined under discharging state and can also be appropriately changed in accordance with the charging feature and the discharging feature of the assembled battery 2.

In FIG. 5(a), let a voltage variation from the time t=x to the time t=y of the unit battery D indicating the maximum voltage be m(max). Also, in FIG. 5(a), let a voltage variation from the time t=x to the time t=y of the unit battery E indicating the minimum voltage be m(min).

Note here that, in FIG. 5(a), m(max) and m(min) satisfy the following equations.

$$m(\text{max}) = \frac{VD\text{max}(y) - VD\text{max}(x)}{y - x} \quad \text{[Equation 5]}$$

$$m(\text{min}) = \frac{VE\text{min}(y) - VE\text{min}(x)}{y - x} \quad \text{[Equation 6]}$$

Here, a difference $\Delta m$ between the variations will be defined. If the difference between the variations is defined as a value based on the angle formed by the slope m(max) and the slope m(min), the difference $\Delta m$ between the variations is given by the following equation.

$$\Delta m = \frac{m(\text{max}) - m(\text{min})}{1 + m(\text{max})m(\text{min})} \quad \text{[Equation 7]}$$

Here, when $\Delta m$ is larger than a predetermined value m(th), it is determined that the unit battery 1 indicating the maximum voltage is deteriorated. In a case as shown in FIG. 5(a) where the difference $\Delta m$ between m(max) denoting a per-predetermined-period voltage variation of the unit battery D indicating the maximum voltage and m(min) denoting a per-predetermined-period voltage variation of the unit battery E indicating the minimum voltage is represented as $\Delta m \leq m(th)$, the deterioration measurement is not conducted. In addition, a per-unit-time variation difference between a deteriorated unit battery 1 and a normal unit battery 1 can be measured and stored in the deterioration determination unit 11 as a predetermined value m(th) in advance. For example, the difference $\Delta m$ between variations can be stored, in advance, in a table prepared in the deterioration determination unit 11.

On the other hand, in a case as shown in FIG. 5(b) where VFmax(t) denoting a voltage varying over time of the unit battery F indicating the maximum voltage, the deterioration determination unit 11 sets the time t=x and the time t=y at a time between the time t=0 and the time t=z4 when the balancing operation starts. The time t=y is set to be later than the time t=x. Here, in FIG. 5(b), let the voltage variation between time t=x and the time t=y of the unit battery F indicating the maximum voltage be m(max). Also, in FIG. 5(b), let the voltage variation between the time t=x and the time t=y of the unit battery E indicating the minimum voltage be m(min). Because the difference $\Delta m$ between m(max) denoting the per-predetermined-period voltage variation of the unit battery F indicating the maximum voltage and m(min) denoting the per-predetermined-period voltage variation of the unit battery E indicating the minimum voltage satisfies the relation $\Delta m > m(th)$, the deterioration measurement is conducted, and then it is determined that the unit battery F indicating the maximum voltage is deteriorated.

Note, however, that m(max) in a case as shown in FIG. 5(b) satisfies the following relation.

$$m(\max) = \frac{VF\max(y) - VF\max(x)}{y - x} \quad \text{[Equation 8]}$$

Next, referring to FIG. 1, explanation will be made about an operation to detect a deteriorated unit battery 1 in the configuration shown in FIG. 1 with the assembled battery 2 being in a charging state. In a state in which the unit batteries 1 included in the assembled battery 2 are being charged, the control unit 10 shown in FIG. 1 acquires the voltages of the unit batteries 1 included in the assembled battery 2. The timing when the control unit 10 acquires the voltages of the multiple unit batteries 1 is the same acquisition timing as that for acquiring the voltage of the assembled battery 2 in a discharging state.

Referring to the voltages of the unit batteries 1 acquired by the control unit 10, the deterioration determination unit 11 detects the unit battery 1 indicating the maximum voltage and the unit battery 1 indicating the minimum voltage among the unit batteries 1. Then, the deterioration determination unit 11 determines that the unit battery 1 indicating the maximum voltage is deteriorated when the difference Δm between m(max) denoting a per-predetermined-period voltage variation of the unit battery 1 indicating the maximum voltage and m(min) denoting a per-predetermined-period voltage variation of the unit battery 1 indicating the minimum voltage is larger than a predetermined value m(th).

Figure 6:
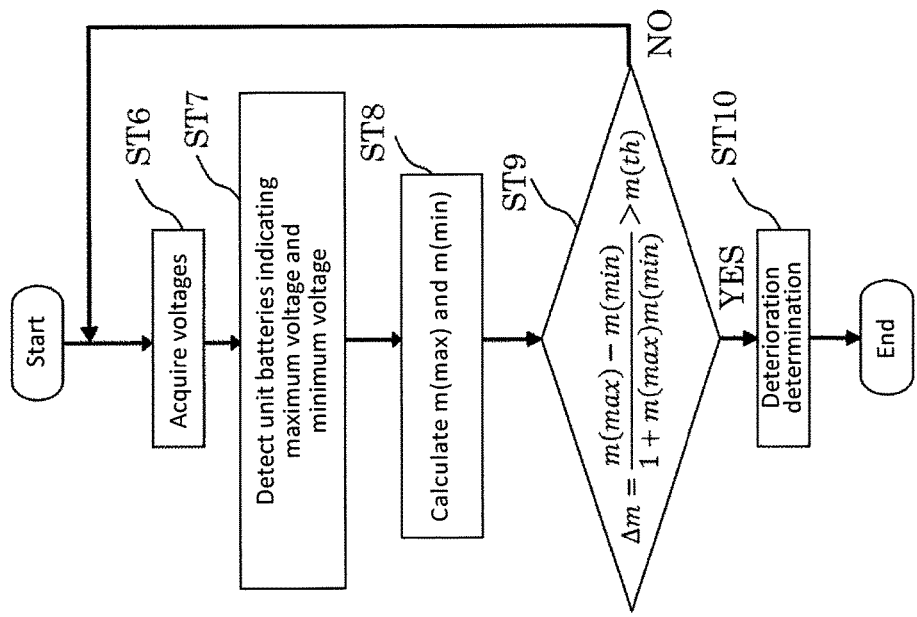
FIG. 6 shows a flowchart according to Embodiment 1 of the present invention, for determining deterioration in a charging state.

Next, a flowchart will be explained which shows steps of deterioration determination when the assembled battery 2 is in a charging state. FIG. 6 shows the deterioration determination steps that are conducted by the storage battery deterioration measurement device 3 when the unit batteries 1 included in the assembled battery 2 are in a charging state. When the steps for deterioration determination are started by the storage battery deterioration measurement device 3, voltages of the multiple unit batteries 1 included in the assembled battery 2 are acquired by the control unit 10 (ST6).

Referring to the voltages of the unit batteries 1 acquired by the control unit 10, the deterioration determination unit 11 detects the unit battery 1 indicating the maximum voltage among the unit batteries 1 and the unit battery 1 indicating the minimum voltage thereamong (ST7). The deterioration determination unit 11 calculates m(max) denoting a per-predetermined-period voltage variation of the unit battery 1 indicating the maximum voltage and m(min) denoting a per-predetermined-period voltage variation of the unit battery 1 indicating the minimum voltage (ST8), and then compares the difference Δm between m(max) and m(min) with a predetermined value m(th) (ST9).

When Δm is larger than the predetermined value m(th), the deterioration determination unit 11 determines that there exists a deteriorated unit battery 1 (ST10) to end the steps. When Δm is smaller than the predetermined value m(th), the deterioration determination unit 11 repeats steps after the step ST6 where voltages of the multiple unit batteries 1 included in the assembled battery 2 are acquired by the control unit 10.

Because the storage battery deterioration measurement device 3 according to Embodiment 1 of the present invention is equipped with the control unit 10 to acquire the information on the states of multiple unit batteries 1 and the deterioration determination unit 11 to have a predetermined value set in advance, to detect the unit battery 1 indicating the maximum value among the information on the states of the multiple unit batteries 1 acquired by the control unit 10 and the unit battery 1 indicating the minimum value thereamong, and to determine that there exists a deteriorated unit battery 1 when the difference between a per-predetermined-period variation of the information on the state of the unit battery 1 indicating the maximum value and a per-predetermined-period variation of the information on the state of the unit battery 1 indicating the minimum value is larger than a predetermined value, the time required to measure the deterioration states of the unit batteries 1 can be shortened than conventional devices.

According to the storage battery deterioration measurement device 3 in Embodiment 1 of the present invention, the information on the states of unit batteries 1 is voltages. Because the deterioration determination unit 11 detects the unit battery 1 indicating the maximum voltage value among voltages of the multiple unit batteries 1 acquired by the control unit 10 and the unit battery 1 indicating the minimum voltage thereamong, and determines that there exists a deteriorated unit battery 1 when the difference between a per-predetermined-period voltage variation of the unit battery 1 indicating the maximum voltage and a per-predetermined voltage variation of the unit battery 1 indicating the minimum voltage is larger than a predetermined value, the time required to measure the deterioration states of the unit batteries 1 can be shortened than conventional devices.

According to the storage battery deterioration measurement device 3 in Embodiment 1 of the present invention, because the deterioration determination unit 11 determines, when the multiple unit batteries 1 discharge and the difference between a per-predetermined-period voltage variation of the unit battery 1 indicating the maximum voltage and a per-predetermined-period voltage variation of the unit battery 1 indicating the minimum voltage is larger than a predetermined value, that the unit battery 1 indicating the minimum voltage is deteriorated, the time required to measure the deterioration states of the unit batteries 1 can, when the unit batteries are in a discharging state, be shortened than conventional devices.

According to the storage battery deterioration measurement device 3 in Embodiment 1 of the present invention, because the deterioration determination unit 11 determines, when the multiple unit batteries 1 are being charged and the difference between a per-predetermined-period voltage variation of the unit battery 1 indicating the maximum voltage and a per-predetermined-period voltage variation of the unit battery 1 indicating the minimum voltage is larger than a predetermined value, that the unit battery 1 indicating the maximum voltage is deteriorated, the time required to measure the deterioration states of the unit batteries 1 can, when the unit batteries are in a charging state, be shortened than conventional devices.

Because the power storage system 21 according to Embodiment 1 of the present invention is equipped with the multiple unit batteries 1 connected in series, the storage battery deterioration measurement device 3 described in Embodiment 1 to detect a deteriorated unit battery 1, and the power control device 22 to control the power provided from the unit batteries 1, the time required to measure the deterioration states of the unit batteries 1 can, when the unit batteries 1 are in a discharging or charging state, be shortened than conventional devices.

Embodiment 2

Figure 7:
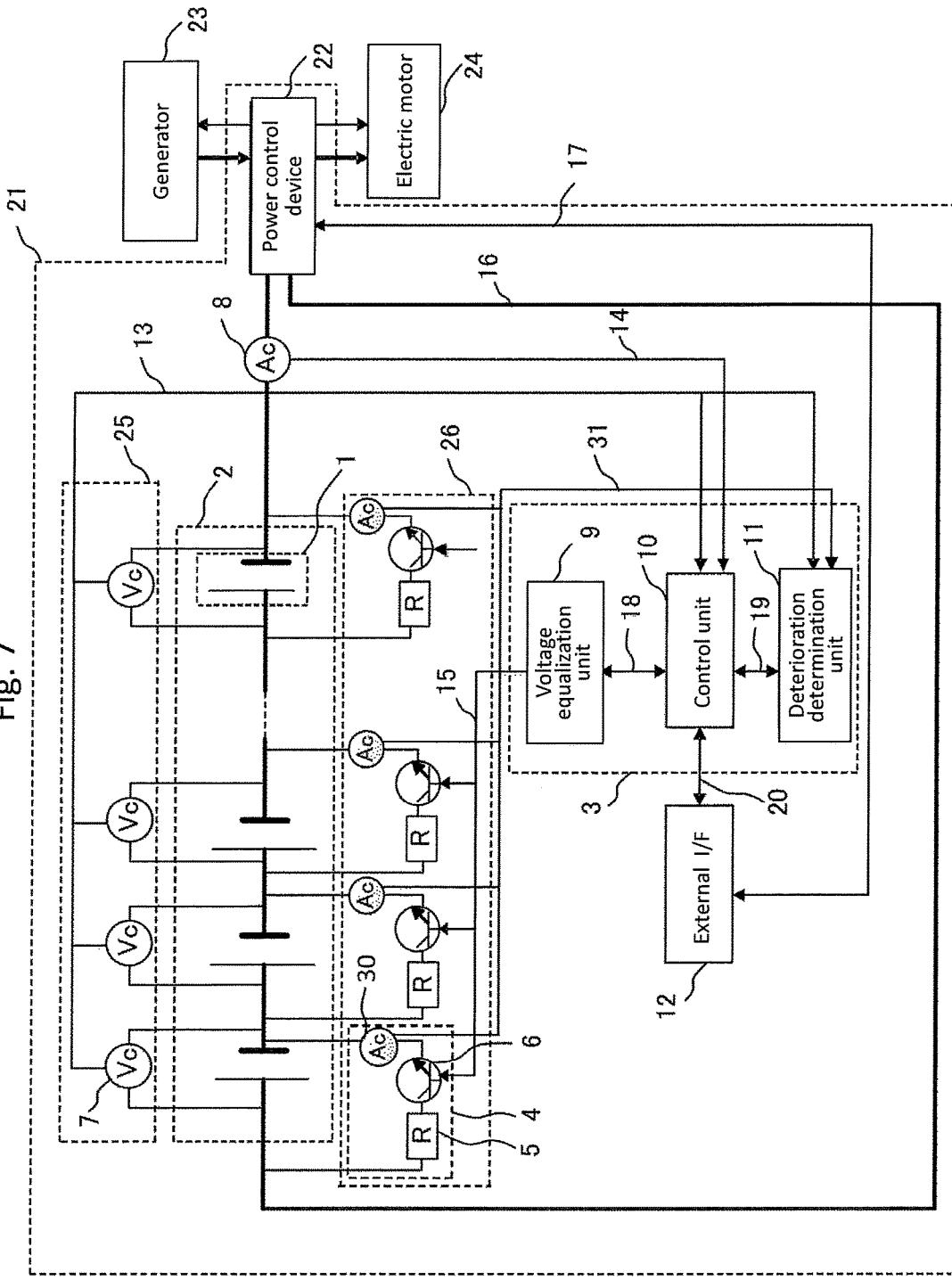
FIG. 7 shows a storage battery deterioration measurement device and a power storage system according to Embodiment 2 of the present invention.

FIG. 7 shows a storage battery deterioration measurement device 3 and a power storage system 21 according to Embodiment 2 of the present invention. Also in Embodiment 2, it is supposed, in explanation, that information on the states of multiple unit batteries 1 is voltages of the unit batteries 1. As shown in FIG. 7, the storage battery deterioration measurement device 3 and the power storage system 21 according to Embodiment 2 of the present invention include a current detector 30 in each balancing circuit 4 explained in Embodiment 1. Because in order that currents detected by the current detectors 30 are acquired and processed by a deterioration determination unit 11, each current detector 30 is connected with the deterioration determination unit 11 via a circuit 31. As the rest of the configuration is the same as in Embodiment 1, the explanation will be omitted.

The storage battery deterioration measurement device 3 and the power storage system 21 according to Embodiment 2 of the present invention detect deterioration of the unit batteries 1 while the balancing operation is conducted. As shown in FIG. 7, the current detector 30, a balancing resistor 5 and a switching element 6 are connected in series in each balancing circuit 4. The current detector 30 detects a balancer current flowing in the balancing circuit 4 when the switching element 6 becomes on state.

The deterioration determination unit 11 acquires the balancer current from the current detector 30 and calculates an accumulation of the balancer current from a time point when a balancing circuit 4 starts operation until a time point when ending the balancing operation. FIG. 8 shows voltage decreases over time of the unit batteries 1 in a discharging state, and balancer current variations by balancing operations.

Figure 8A:
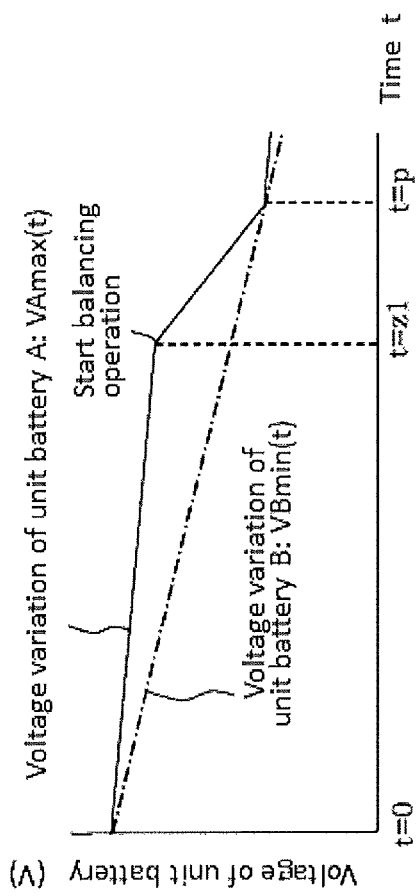
FIG. 8A shows accumulations of balancer currents in a discharging state in Embodiment 2 of the present invention.

FIG. 8(a) is the same as shown in FIG. 3(a) where the voltage decreases of the unit batteries 1 are illustrated. Namely, the figure shows the voltage variation of a unit battery A indicating the maximum voltage among the unit batteries 1 included in the assembled battery 2 and the voltage variation of a unit battery B indicating the minimum voltage thereamong. As explained in FIG. 3(a) above, a balancing operation for the unit battery A starts at the time t=z1 and ends at the time t=p.

Figure 8B:
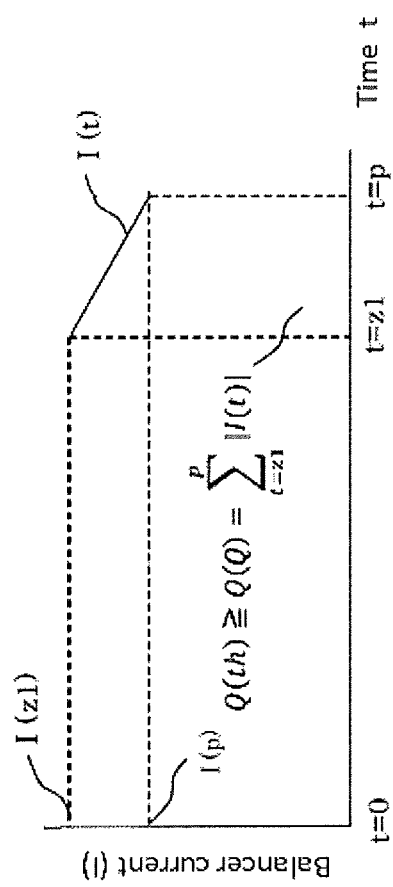
FIG. 8B shows accumulations of balancer currents in a discharging state in Embodiment 2 of the present invention.

FIG. 8(b) shows a current I(t) varying over time detected by the current detector 30 when a balancer current flows in the balancing circuit 4 shown in FIG. 7. As shown in FIG. 8(b), because the balancing operation is not conducted between the time t=0 and the time t=z1 when the balancing operation is started, the balancer current I(t) varying over time is 0. At the time t=z1 when the balancing operation starts, the switching element 6 becomes on state and the current detector 30 detects the balancer current. Because the resistance value of the balancing resistor 5 included in the balancing circuit 4 is a constant value, the balancer current decreases as the voltage of the unit battery A decreases. At the time t=z1, the balancer current takes the maximum value I(z1), and then decreases as time elapses; at the time t=p when the balancing operation ends, the balancer current takes the minimum value I(p) which is smaller than I(z1).

As shown in FIG. 8(b), an accumulation Q of the balancer current flowing in the balancing circuit 4 between the time z1 and the time p can be calculated by the deterioration determination unit 11 on the basis of the following equation.

$$Q = \sum_{t=z1}^{p} |I(t)| \quad \text{[Equation 9]}$$

Figure 8C:
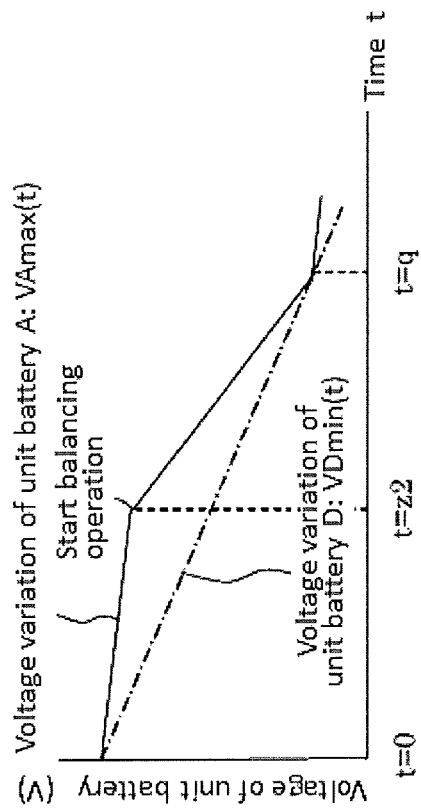
FIG. 8C shows accumulations of balancer currents in a discharging state in Embodiment 2 of the present invention.

Explanation will be made on a case where a unit battery D exists whose per-unit-time voltage decrease is larger than that of the unit battery B, as shown in FIG. 8(c). FIG. 8(c) is similar to FIG. 3(b) where decreases in voltages of unit batteries 1 are illustrated. Namely, the figure shows a voltage variation of a unit battery A indicating the maximum voltage among the unit batteries 1 included in the assembled battery 2 and a voltage variation of a unit battery D indicating the minimum voltage thereamong. As explained in FIG. 3(b), the balancing operation starts at the time t=z2 and ends at the time t=q.

The time (q-z2) required for balancing operation shown in FIG. 8(c) is longer than the time (p-z1) required for the balancing operation shown in FIG. 8(a). More specifically, this indicates that an accumulation Q of a balancer current shown in FIG. 8(d) is larger than an accumulation Q of a balancer current shown in FIG. 8(b).

Figure 8D:
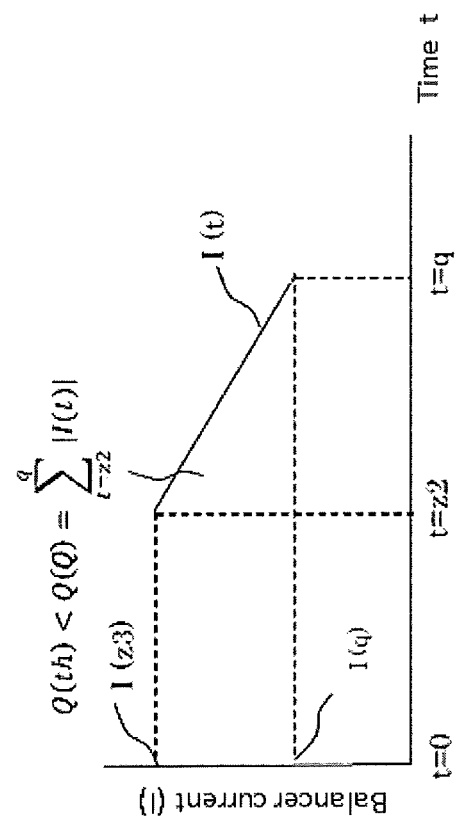
FIG. 8D shows accumulations of balancer currents in a discharging state in Embodiment 2 of the present invention.

As shown in FIG. 8(d), the accumulation Q of the balancer current flowing in the balancing circuit 4 between the time t=z2 and the time t=q can be calculated by the deterioration determination unit 11 on the basis of the following equation.

$$Q = \sum_{t=z2}^{q} |I(t)| \quad \text{[Equation 10]}$$

Therefore, the storage battery deterioration measurement device 3 and the power storage system 21 according to Embodiment 2 of the present invention determine, when the assembled battery 2 is in a discharging state and the balancer current accumulation Q from the balancing operation start time becomes larger than a predetermined value Q(th), that there exists a deteriorated unit battery 1.

As shown in FIG. 8(b), when the current accumulation Q between the time t=z1 and the time t=p is equal to or smaller than the predetermined value Q(th), more specifically when Q≤Q(th), deterioration measurement is not conducted.

In contrast, as shown in FIG. 8(d), when the current accumulation Q between the time t=z2 and the time t=q is larger than the predetermined value Q(th), more specifically when Q>Q(th), the deterioration determination unit 11 conducts deterioration measurement and determines that the unit battery 1 indicating the minimum voltage then is deteriorated.

Next, explanation will be made referring to FIG. 7 about an operation to detect a deteriorated unit battery 1 in the configuration shown in FIG. 7 in a state in which the assembled battery 2 is discharging and the balancing operation is being conducted. When the difference between the voltage of the unit battery 1 indicating the maximum voltage among the unit batteries 1 included in the assembled battery 2 and the voltage of the unit battery 1 indicating the minimum voltage thereamong becomes larger than a predetermined value, a control unit 10 controls a voltage equalization unit 9 to operate the balancing circuit 4 via the circuit 15.

When the balancing operation starts, the deterioration determination unit 11 acquires a balancer current flowing in the balancing circuit 4 and, on the basis of the acquired balancer current, calculates a balancer current accumulation Q from the point of time when the balancing circuit 4 starts the operation. When the balancer current accumulation Q is larger than the predetermined value Q(th), it is determined that the unit battery 1 indicating the minimum voltage is deteriorated.

Figure 9:
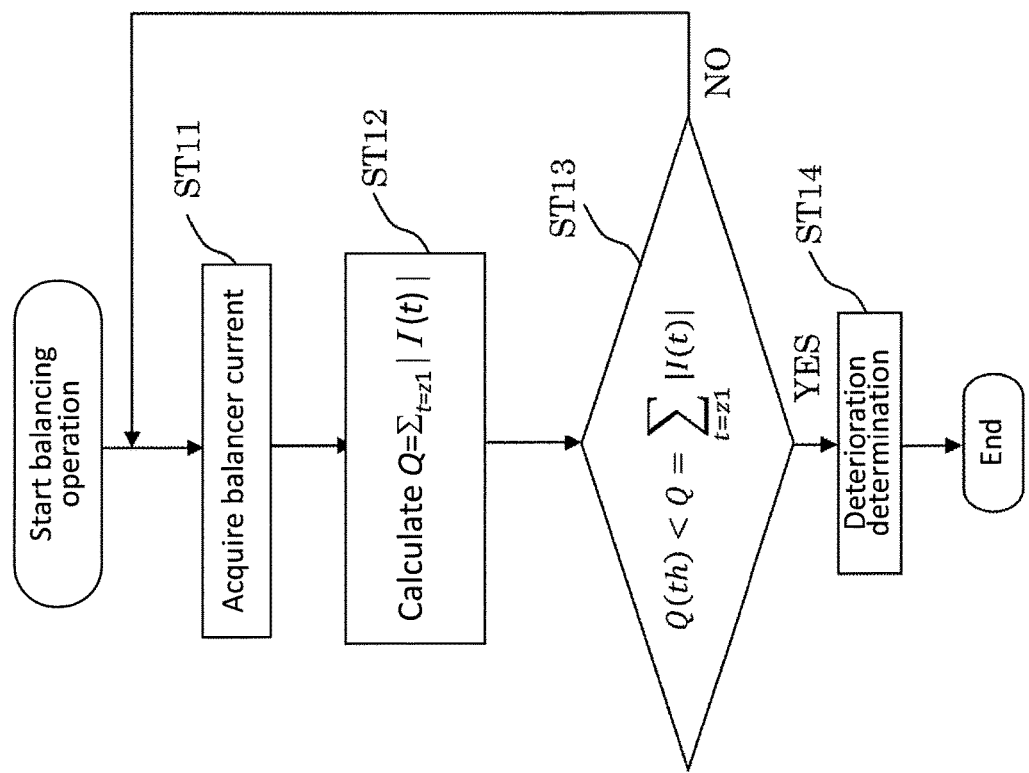
FIG. 9 shows a flowchart for determining deterioration in a discharging state in Embodiment 2 of the present invention.

Next, explanation will be made about a flowchart showing steps of the deterioration determination conducted in a state in which the assembled battery 2 is in a discharging state and a balancing operation is being conducted. FIG. 9 shows steps of the deterioration determination by the deterioration determination unit 11 in a state in which the unit batteries 1 included in the assembled battery 2 are in a discharging state. When the balancing operation is started by the voltage equalization unit 9, the deterioration determination unit 11 acquires the balancer current flowing in the balancing circuit 4 (ST11).

Next, deterioration determination unit 11 calculates a balancer current accumulation Q from the point of time when the balancing circuit 4 starts the operation (ST12). Next, deterioration determination unit 11 compares the calculated balancer current accumulation Q with the predetermined value Q(th) (ST13). When the calculated balancer current accumulation Q becomes larger than the predetermined value Q(th), the deterioration determination unit 11 determines that there exists a deteriorated unit battery 1 (ST14), and then ends the procedure. Note, however, that, when the balancer current accumulation Q is equal to or smaller than the predetermined value Q(th), the deterioration determination unit 11 repeats steps after the step (ST11) to acquire the balancer current of the circuit which is conducting the balancing operation.

(When Charging)

Figure 10A:
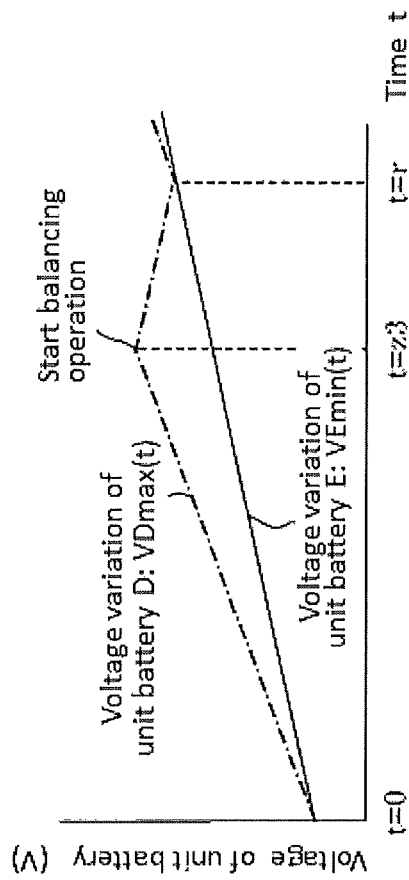
FIG. 10A shows accumulations of the balancer currents in a charging state in Embodiment 2 of the present invention.
Figure 10C:
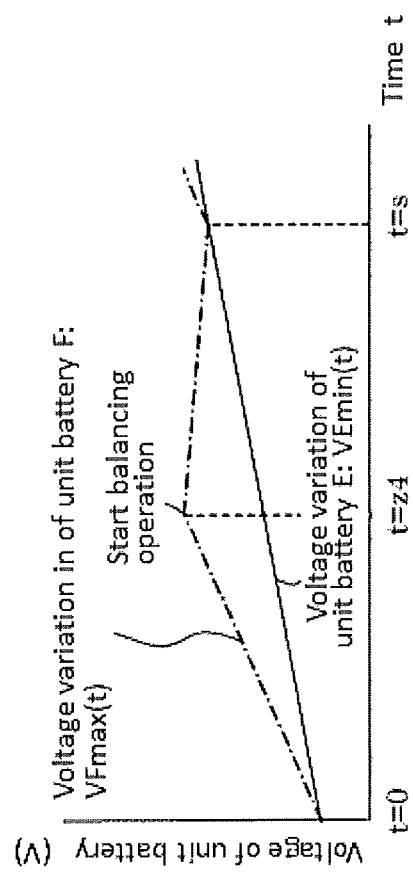
FIG. 10C shows accumulations of the balancer currents in a charging state in Embodiment 2 of the present invention.
Figure 10D:
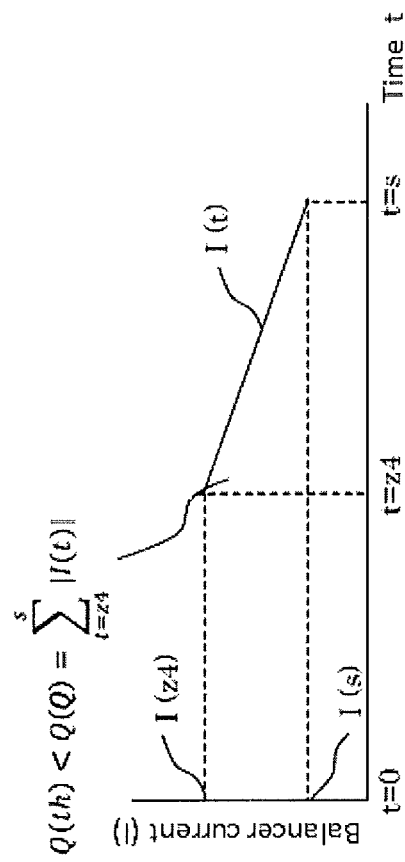
FIG. 10D shows accumulations of the balancer currents in a charging state in Embodiment 2 of the present invention.

Next, explanation will be made about how the deterioration of the unit battery 1 is measured on the basis of the balancer current of the balancing operation in a charging state of the assembled battery 2. FIG. 10(*a*) is the same as shown in FIG. 5(*a*) where the increases in voltage of the unit batteries 1 are illustrated. Namely, the figure shows VDmax(t) denoting a voltage varying over time of the unit battery D indicating the maximum voltage among the unit batteries 1 included in the assembled battery 2 being in a charging state, and VEmin(t) denoting a voltage varying over time of the unit battery E including the minimum voltage thereamong. As explained in FIG. 5(*a*), the balancing operation for the unit battery D starts at the time t=z3 and ends at the time t=r.

FIG. 10(*b*) shows I(t) denoting a variation over time in the balancer current detected by the current detector 30 when the balancer current flows in the balancing circuit 4 shown in FIG. 7. As shown in FIG. 10(*b*), because the balancing operation is not conducted between the time t=0 and the time t=z3 when the balancing operation is started, the variation I(t) in the balancer current is 0 therebetween. At the time t=z3 when the balancing operation is started, the switching element 6 becomes on and the current detector 30 detects the balancer current. Because the resistance value of the balancing resistor 5 included in the balancing circuit 4 is a constant value, the balancer current decreases as the voltage of the unit battery D decreases. The balancer current takes the maximum value I(z3) at the time t=z3, and then decreases as time elapses to take, at the time t=r when the balancing operation ends, the minimum value I(r) of the balancer current smaller than I(z3).

As shown in FIG. 10(*b*), an accumulation Q of the balancer current flowing in the balancing circuit 4 between the time t=z3 and the time t=r can be calculated by the deterioration determination unit 11 on the basis of the following equation.

$$Q = \sum_{t=z3}^{r} |I(t)| \qquad \text{[Equation 11]}$$

Explanation will also be made on a case where a unit battery F exists, whose per-unit-time voltage increase is larger than that of the unit battery D as shown in FIG. 10(*c*). FIG. 10(*c*) is the same as shown in FIG. 5(*b*) where voltage increases in the unit batteries 1 are illustrated. Namely, the figure shows VFmax(t) denoting a voltage varying over time of the unit battery F indicating the maximum voltage among the unit batteries 1 included in the assembled battery 2, and VEmin(t) denoting a voltage variation of the unit battery E including the minimum voltage thereamong. As explained in FIG. 5(*b*), the balancing operation starts at the time t=z4 and ends at the time t=s.

The time (s-z4) required for the balancing operation shown in FIG. 10(*c*) is longer than the time (r-z3) required for the balancing operation shown in FIG. 10(*a*). More specifically, this indicates that the accumulation Q of the balancer current shown in FIG. 10(*d*) is larger than the accumulation Q of the balancer current shown in FIG. 10(*b*).

As shown in FIG. 10(*d*), the accumulation Q of the balancer current flowing in the balancing circuit 4 between the time t=z4 and the time t=s can be calculated by the deterioration determination unit 11 on the basis of the following equation.

$$Q = \sum_{t=z4}^{s} |I(t)| \qquad \text{[Equation 12]}$$

Therefore, the storage battery deterioration measurement device 3 and the power storage system 21 according to Embodiment 2 of the present invention determine, when the assembled battery 2 is in a charging state and the balancer current accumulation Q accumulated from the starting time point of the balancing operation becomes larger than a predetermined value Q(th), that there exists a deteriorated unit battery.

As shown in FIG. 10(*b*), when the current accumulation Q between the time t=z3 and the time t=r is equal to or smaller than the predetermined value Q(th), more specifically when Q≤Q(th), the deterioration measurement is not conducted.

In contrast, as shown in FIG. 10(*d*), when the current accumulation Q between the time t=z4 and the time t=s is larger than the predetermined value Q(th), more specifically when Q>Q(th), the deterioration measurement is conducted and it is determined that the unit battery 1 indicating the maximum voltage then is deteriorated.

In the storage battery deterioration measurement device 3 and the power storage system 21 according to Embodiment 2, the accumulation Q of the balancer current flowing in the balancing circuit 4 is calculated. Note however that, because the accumulation Q of the balancer current is in proportion to the duration time of the balancing operation, the deterioration of the unit battery 1 may be determined on the basis of the duration time of the balancing operation from its starting time point.

Next, referring to FIG. 7, explanation will be made about the operation of the configuration shown in FIG. 7, in which a deteriorated unit battery 1 is detected in a state in which the storage battery is being charged and a balancing operation is being conducted. When the difference between the voltage of the unit battery 1 indicating the maximum voltage among the unit batteries 1 included in the assembled battery 2 and the voltage of the unit battery 1 indicating the minimum voltage thereamong becomes larger than a predetermined value, a control unit 10 controls a voltage equalization unit 9 to make the voltage equalization unit 9 operate a balancing circuit 4 via the circuit 15.

When the balancing operation is started, the deterioration determination unit 11 acquires the balancer current flowing in the balancing circuit 4 to calculate, on the basis of the acquired balancer current, the balancer current accumulation Q from the time point when the balancing circuit 4 starts the operation. When the balancer current accumulation Q is larger than the predetermined value Q(th), it is determined that the unit battery 1 indicating the maximum voltage is deteriorated.

Figure 11:
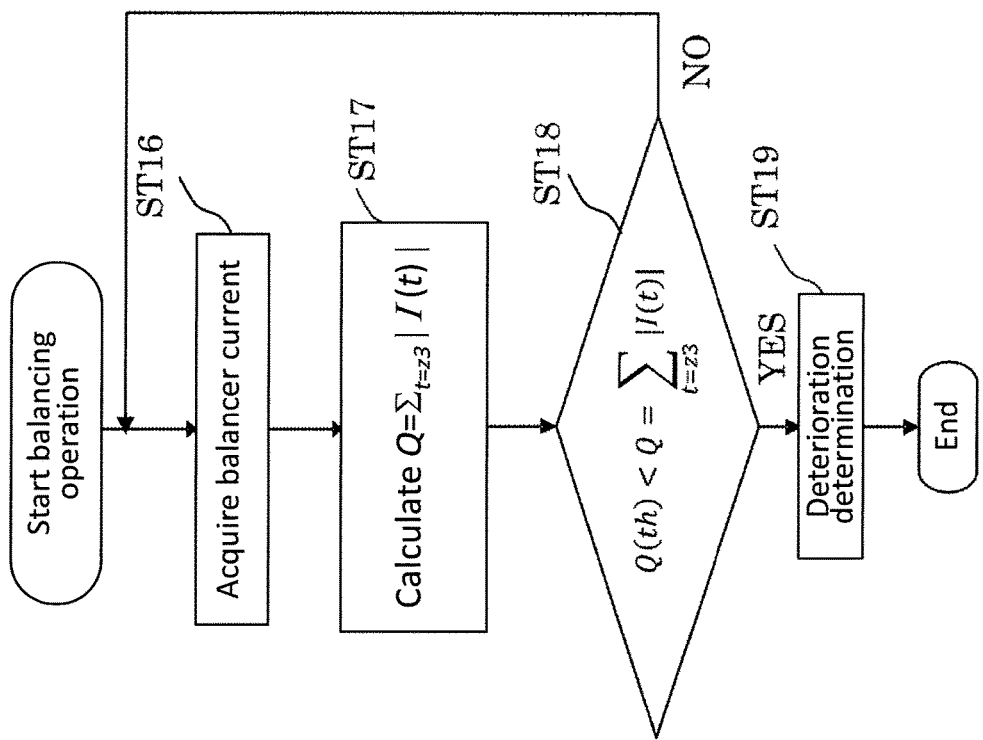
FIG. 11 shows a flowchart according to Embodiment 2 of the present invention for determining deterioration in a charging state.

Next, a flowchart will be explained which shows steps of the deterioration determination in a state in which the assembled battery is being charged and the balancing operation is being conducted. FIG. 11 shows steps of the deterioration determination by the deterioration determination unit 11 in a state in which the unit batteries 1 included in the assembled battery 2 are in a charging state. When the balancing operation is started by the voltage equalization unit 9, the deterioration determination unit 11 acquires the balancer current flowing in the balancing circuit 4 (ST16).

Next, the deterioration determination unit 11 calculates the balancer current accumulation Q from the time point when the balancing circuit 4 starts operating (ST17). Next, the deterioration determination unit 11 compares the calculated balancer current accumulation Q with the predetermined value Q(th) (ST18). When the calculated balancer current accumulation Q becomes larger than the predetermined value Q(th), the deterioration determination unit 11 determines that there exists a deteriorated unit battery 1 (ST19), and then ends the procedure. Note, however, that, when the balancer current accumulation Q is equal to or smaller than the predetermined value Q(th), the deterioration determination unit 11 repeats steps after the step (ST16) to acquire the balancer current of the circuit conducting the balancing operation.

In Embodiment 2 of the present invention, the current accumulation Q is acquired by the current detector 30 of the balancing circuit 4 provided to each of unit batteries 1 for determining the deterioration thereof. However, the current accumulation Q may be acquired by calculating the balancer current from the value of the voltage detector 7 and the balancing resistor 5 shown in FIG. 7. In this case, the current detector 30 may be omitted from the configuration.

The storage battery deterioration measurement device 3 according to Embodiment 2 of the present invention includes a voltage equalization unit 9 to operate a balancing circuit 4 provided in parallel to each of the multiple unit batteries 1, wherein the deterioration determination unit 11 detects a unit battery 1 indicating the maximum voltage among the voltages of the multiple unit batteries 1 acquired by the control unit 10 and a unit battery 1 indicating the minimum voltage thereamong, the control unit 10 controls the voltage equalization unit 9 to make, when a per-predetermined-period difference between the voltage of the unit battery 1 indicating the maximum voltage and the voltage of the unit battery 1 indicating the minimum voltage becomes larger than a predetermined value, the balancing circuits 4 operate, and the deterioration determination unit 11 acquires a balancer current flowing in the balancing circuit 4 and calculates, on the basis of the acquired balancer current, a balancer current accumulation from the point of time when the balancing circuit 4 starts operating, and determines, when the balancer current accumulation becomes larger than a predetermined value, that there exists a deteriorated unit battery. Therefore, the time required to measure the deterioration states of the unit batteries 1 in the assembled battery 2 conducting a balancing operation can also be shortened than conventional devices.

In a state in which the multiple unit batteries 1 are discharging, the deterioration determination unit 11 of the storage battery deterioration measurement device 3 according to Embodiment 2 of the present invention determines, when the balancer current accumulation becomes larger than a predetermined value, that the unit battery 1 indicating the minimum voltage is deteriorated. Therefore, the time required to measure the deterioration state of the unit battery 1 conducting a balancing operation in a discharging state can be shortened than conventional devices.

In a state in which the multiple unit batteries 1 are charging, the deterioration determination unit 11 of the storage battery deterioration measurement device 3 according to Embodiment 2 of the present invention determines, when the balancer current accumulation becomes larger than a predetermined value, that the unit battery 1 indicating the maximum voltage is deteriorated. Therefore, the time required to measure the deterioration state of the unit battery 1 conducting a balancing operation in a charging state can be shortened than conventional devices.

Because the power storage system 21 according to Embodiment 2 of the present invention is equipped with the multiple unit batteries 1 connected in series, the storage battery deterioration measurement device 3 described in Embodiment 1 to detect deterioration in the unit batteries 1, and the power control device 22 to control the power provided from the unit batteries 1, the time required to measure the deterioration state of the unit battery 1 under balancing operation in a discharging or charging state can be shortened than conventional systems.

Embodiment 3

Figure 12:
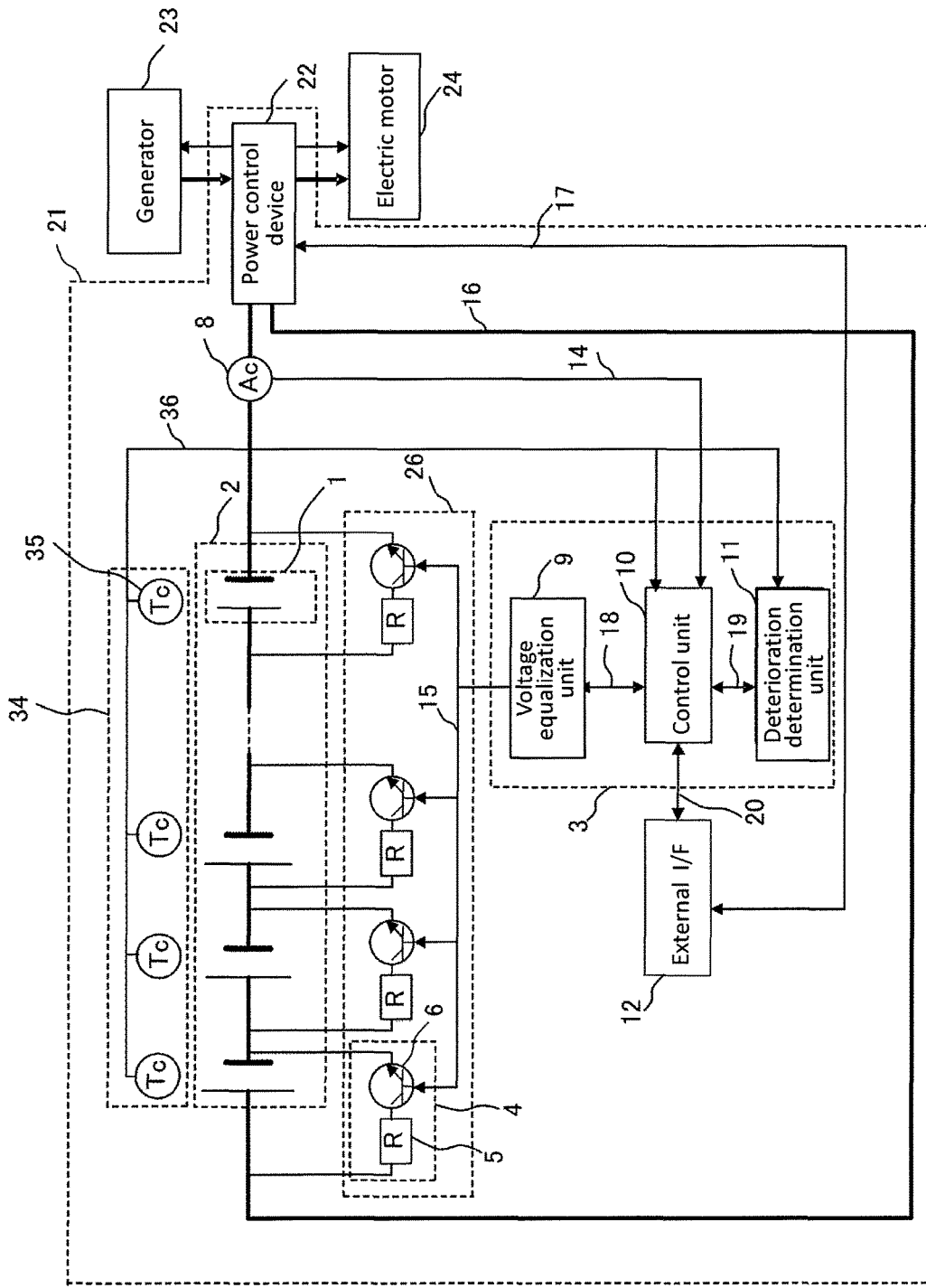
FIG. 12 shows a storage battery deterioration measurement device and a power storage system according to Embodiment 3 of the present invention.

FIG. 12 shows a storage battery deterioration measurement device 3 and a power storage system 21 according to Embodiment 3 of the present invention. In Embodiment 3, explanation will be made under supposition that information on the states of multiple unit batteries 1 is temperatures of the unit batteries 1. As shown in FIG. 12, the storage battery deterioration measurement device 3 and the power storage system 21 according to Embodiment 3 have a same configuration as that in Embodiment 1 except that the voltage detection unit 25 in Embodiment 1 is replaced with a temperature detection unit 34. Therefore, explanation on the configuration other than the temperature detection unit 34 will be omitted. The temperature detection unit 34 includes temperature detectors 35 provided to the respective multiple unit batteries 1 included in an assembled battery 2. The temperature detectors 35 can measure temperatures of the unit batteries 1, and may use, for example, temperature sensors that can measure surface temperatures or electrode temperatures of the unit batteries 1.

Embodiment 3 utilizes a fact that a deteriorated unit battery 1 has an increased internal resistance, to have much joule heat during charging or discharging periods. In a case where the unit battery 1 is deteriorated, the deterioration of the unit battery 1 can be determined (measured) by detecting, irrespective of charging or discharging, a temperature increase of the unit battery 1. Therefore, the configuration can be simplified.

The storage battery deterioration measurement device 3 and the power storage system 21 according to Embodiment 3 use a method to determine, when the difference between a per-predetermined-period temperature variation of the unit battery 1 indicating the maximum temperature among the temperatures of the multiple unit batteries 1 and a per-predetermined-period temperature variation of the unit battery 1 indicating the minimum temperature thereamong is larger than a predetermined value, that the unit battery 1 indicating the maximum temperature is deteriorated. Note that the determination on the difference between the variations is conducted by the deterioration determination unit 11 shown in FIG. 12.

Figure 13A:
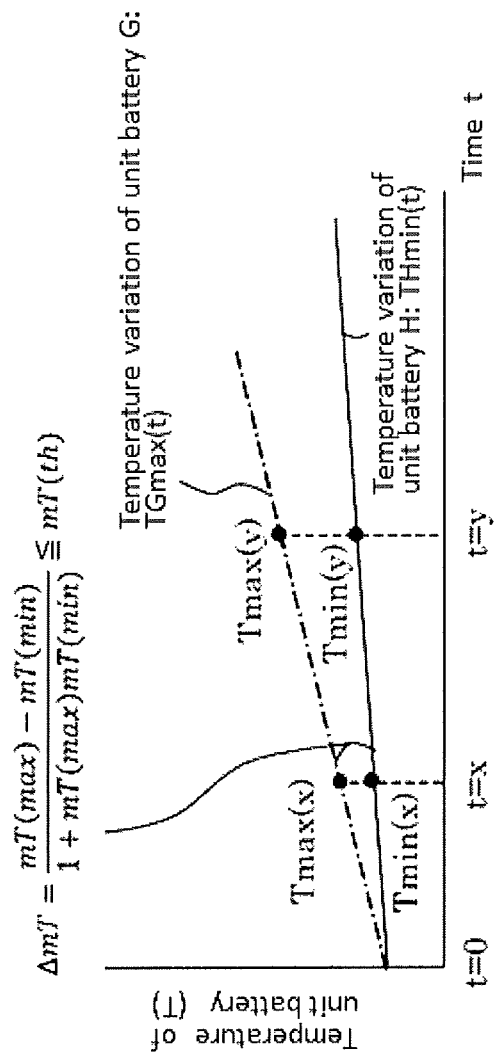
FIG. 13A shows how unit batteries' temperatures increase with the lapse of time in a charging or discharging state in Embodiment 3 of the present invention.
Figure 13B:
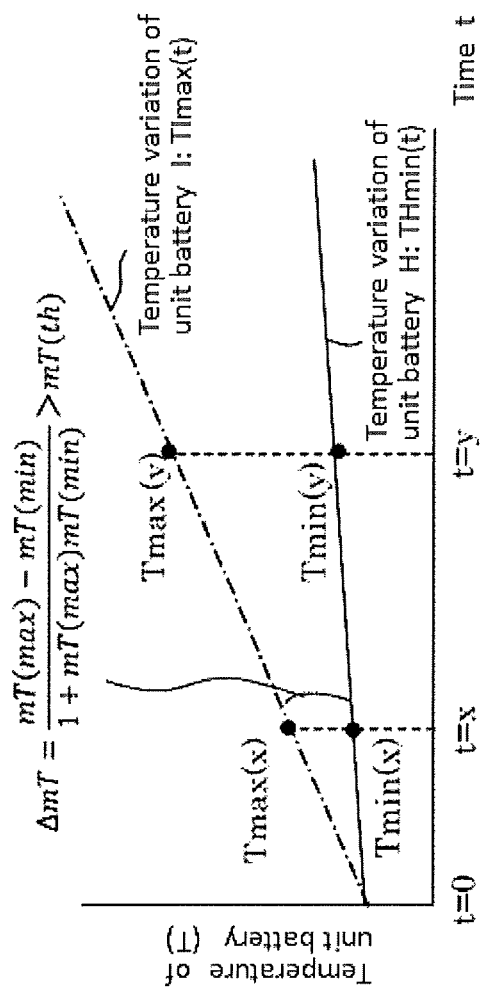
FIG. 13B shows how unit batteries' temperatures increase with the lapse of time in a charging or discharging state in Embodiment 3 of the present invention.

Here, the per-predetermined-period temperature variation of the unit battery 1 in a charging or discharging state will be explained. As shown in FIG. 13, let the time point to start discharging or charging be t=0. The time t=x and the time t=y are set at time points later than time t=0. Note that the time t=y is later than the time t=x.

In FIG. 13(*a*), TGmax(t) denoting the temperature variation of a unit battery G indicating the maximum temperature among the unit batteries 1 included in the assembled battery 2 is represented by a dashed and dotted line. THmin(t) denoting the temperature variation of a unit battery H indicating the minimum temperature among the unit batteries 1 included in the assembled battery 2 is represented by a full line. In FIG. 13(*a*), let the slopes of the temperature variations from the time t=x to the time t=y in the unit battery G and the unit battery H be mT(max) and mT(min), respectively. Namely, a per-predetermined-period temperature variation of the unit battery 1 indicating the maximum temperature is shown as mT(max) and a per-predetermined-period temperature variation of the unit battery 1 indicating the minimum temperature is shown as mT(min).

Note, however, that mT(max) and mT(min) satisfy the following relations in FIG. 13(*a*).

$$mT(\max) = \frac{TG\max(y) - TG\max(x)}{y - x} \quad \text{[Equation 13]}$$

$$mT(\min) = \frac{TH\min(y) - TH\min(x)}{y - x} \quad \text{[Equation 14]}$$

Here, ΔmT denoting the difference between temperature variations will be defined. If the difference between temperature variations is defined as a value based on the angle formed by the slope mT(max) and the slope mT(min), ΔmT is given by the following equation.

$$\Delta mT = \frac{mT(\max) - mT(\min)}{1 + mT(\max)mT(\min)} \quad \text{[Equation 15]}$$

When ΔmT is larger than a predetermined value of mT(th), it is determined that the unit battery indicating the maximum temperature is deteriorated. More specifically, in a case shown in FIG. 13(*a*), because ΔmT denoting the difference between the per-predetermined-period temperature variation mT(max) of the unit battery G indicating the maximum temperature and the per-predetermined-period temperature variation mT(min) of the unit battery H indicating the minimum temperature satisfies the relation ΔmT≤mT(th), deterioration measurement will not be conducted. Note that, as for the predetermined value mT(th), the difference between a per-predetermined-period temperature variation of an already-deteriorated unit battery 1 and that of a normal unit battery 1 can be measured in advance to be stored in the deterioration determination unit 11. For example, the difference Δm between the variations can be stored in advance in a table prepared in the deterioration determination unit 11.

On the other hand, in a case as shown in FIG. 13(*b*) where a temperature variation over time of a unit battery I indicating the maximum temperature is represented as TImax(t), when ΔmT denoting the difference between a per-predetermined-period temperature variation mT(max) of a unit battery I indicating the maximum temperature and a per-predetermined-period temperature variation mT(min) of a unit battery H indicating the minimum temperature satisfies the relation ΔmT>mT(th), deterioration measurement will be conducted, and then it is determined that the unit battery I indicating the maximum temperature is deteriorated.

Note, however, that mT(max) in a case as shown in FIG. 13(*b*) satisfies the following relation.

$$mT(\max) = \frac{TI\max(y) - TI\max(x)}{y - x} \quad \text{[Equation 16]}$$

Figure 14:
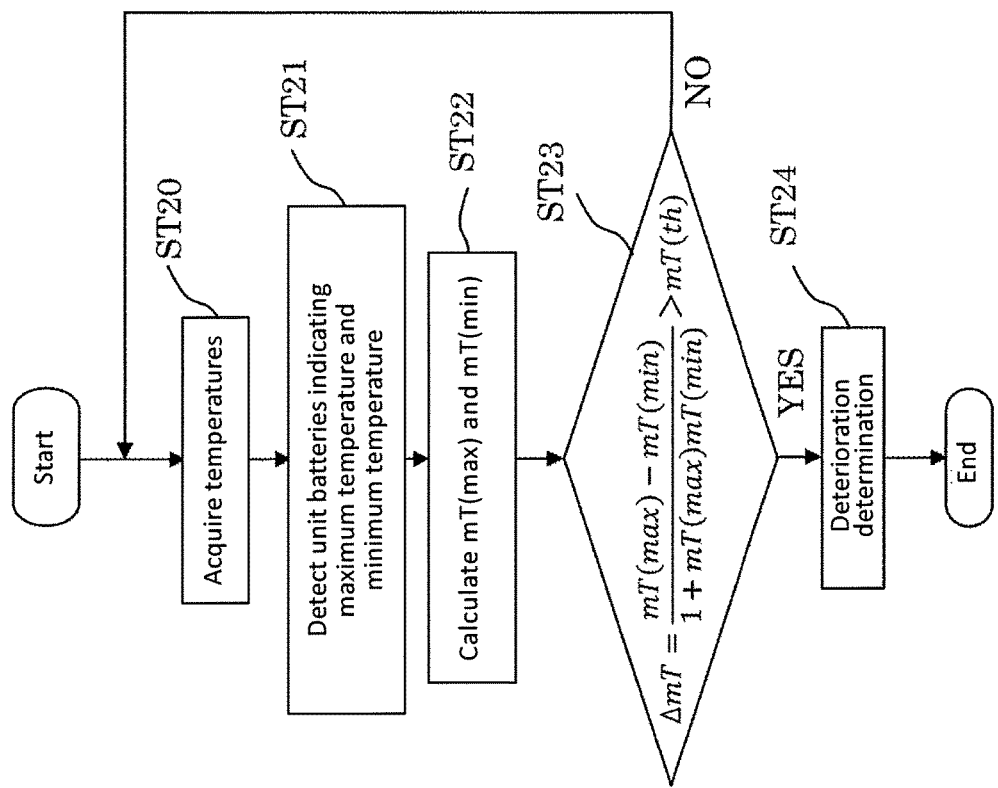
FIG. 14 shows a flowchart according to Embodiment 3 of the present invention for determining deterioration in a charging or discharging state.

Next, referring to FIG. 14, explanation will be made about an operation to detect a deteriorated unit battery 1 in the configuration shown in FIG. 12 in a charging or discharging state of the assembled battery 2. In a state in which the unit batteries 1 included in the assembled battery 2 are being charged or discharged, the control unit 10 shown in FIG. 12 acquires the temperatures of the unit batteries 1 included in the assembled battery 2. The control unit 10 may periodically acquire the temperatures of all the multiple unit batteries 1, or may simultaneously acquire the temperatures of all the unit batteries 1 at a predetermined cycle, for example, every a few hours in a day.

Among the unit batteries 1, the deterioration determination unit 11 detects the unit battery 1 indicating the maximum temperature and the unit battery 1 indicating the minimum temperature, referring to the temperatures of the unit batteries 1 acquired by the control unit 10 from the temperature detectors 35 via a circuit 36. When ΔmT denoting the difference between a per-predetermined-period temperature variation mT(max) of the unit battery 1 indicating the maximum temperature and a per-predetermined-period temperature variation mT(min) of the unit battery 1 indicating the minimum temperature is larger than the predetermined value mT(th), the deterioration determination unit 11 determines that the unit battery 1 indicating the maximum temperature is deteriorated.

Next, a flowchart will be explained which shows steps of the deterioration determination in a state in which the assembled battery 2 is charging or discharging. FIG. 14 shows steps of the deterioration determination by the storage battery deterioration measurement device 3 in a state in which the unit batteries 1 included in the assembled battery 2 are charging or discharging. When the steps of the deterioration determination are started by the storage battery deterioration measurement device 3, the control unit 10 acquires the temperatures of the multiple unit batteries 1 included in the assembled battery 2 (ST20).

The deterioration determination unit 11 detects the unit battery 1 indicating the maximum temperature among the temperatures of the unit batteries 1 and the unit battery 1 indicating the minimum temperature thereamong, referring to the temperatures of the unit batteries 1 acquired by the control unit 10 (ST21). The deterioration determination unit 11 calculates a per-predetermined-period temperature variation mT(max) of the unit battery 1 indicating the maximum temperature and a per-predetermined-period temperature variation mT(min) of the unit battery 1 indicating the minimum temperature (ST22), and compares the difference ΔmT between mT(max) and mT(min) with the predetermined value mT(th) (ST23).

When ΔmT is larger than the predetermined value mT(th), the deterioration determination unit 11 determines that there exists a deteriorated unit battery 1 (ST24) and ends the procedure. Note, however, when ΔmT is smaller than the predetermined value mT(th), the deterioration determination unit 11 repeats steps after the step (ST20) at which the control unit 10 acquires the temperatures values of the multiple unit batteries 1 included in the assembled battery 2.

Figure 15:
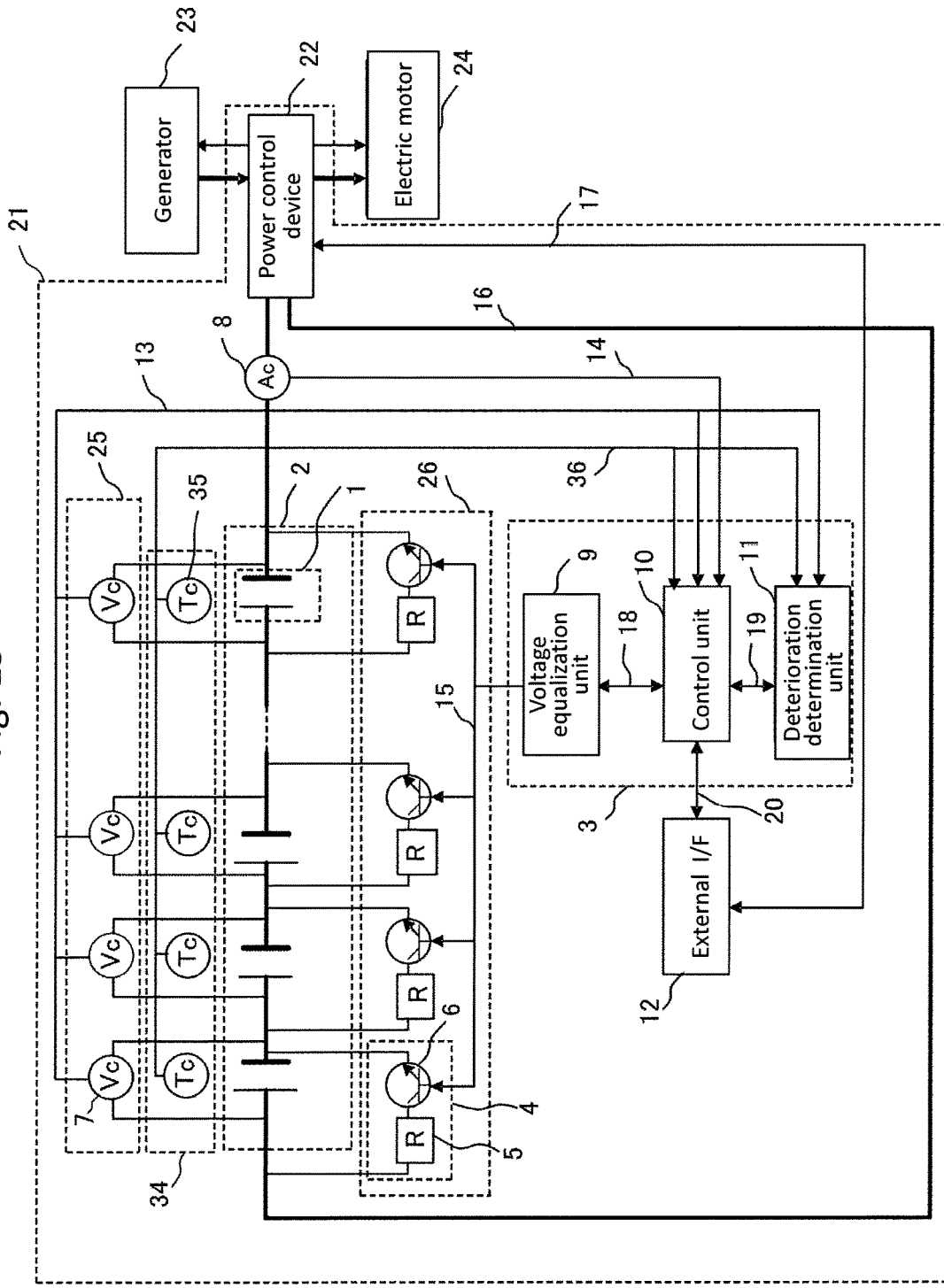
FIG. 15 shows a variation example of a storage battery deterioration measurement device and a power storage system according to Embodiment 3 of the present invention.

The storage battery deterioration measurement device 3 and the power storage system 21 according to Embodiment 3 of the present invention may further include a voltage detector 7 for each of the unit batteries 1 as shown in Embodiment 1. FIG. 15 shows the storage battery deterioration measurement device 3 and the power storage system 21 which further include a voltage detector 7 besides a temperature detector 35 for each of the unit batteries 1.

According to the modification example of Embodiment 3, because voltages values and temperatures values are considered as factors of the deterioration determination, even in a case where either the voltage detector 7 or the temperature detector 35 provided to a unit battery 1 breaks down, deterioration of the unit battery 1 can be detected.

In the storage battery measurement device 3 according to Embodiment 3 of the present invention, the control unit 10 acquires temperatures of the multiple unit batteries 1, and the deterioration determination unit 11 detects a unit battery 1 indicating the maximum temperature among the temperatures of the multiple unit batteries 1 acquired by the control unit 10 and a unit battery 1 indicating the minimum temperature thereamong, and determines, when the difference between a per-predetermined-period temperature variation of the unit battery 1 indicating the maximum temperature and a per-predetermined-period temperature variation of the unit battery 1 indicating the minimum temperature is larger than a predetermined value, that the unit battery 1 indicating the maximum temperature is deteriorated. Therefore, the time required to measure the deterioration state of the unit batteries 1 can be shortened than conventional devices, using a same configuration irrespective of charging or discharging.

The power storage system 21 according to Embodiment 3 of the present invention includes the multiple unit batteries 1 connected in series, the storage battery deterioration measurement device 3 described in Embodiment 1, and the power control device 22 to control power supplied from the unit batteries 1. Therefore, the time required to measure the deterioration state of the unit batteries 1 can be shortened than conventional devices, using a same configuration irrespective of charging or discharging.

Embodiment 4

Figure 16:
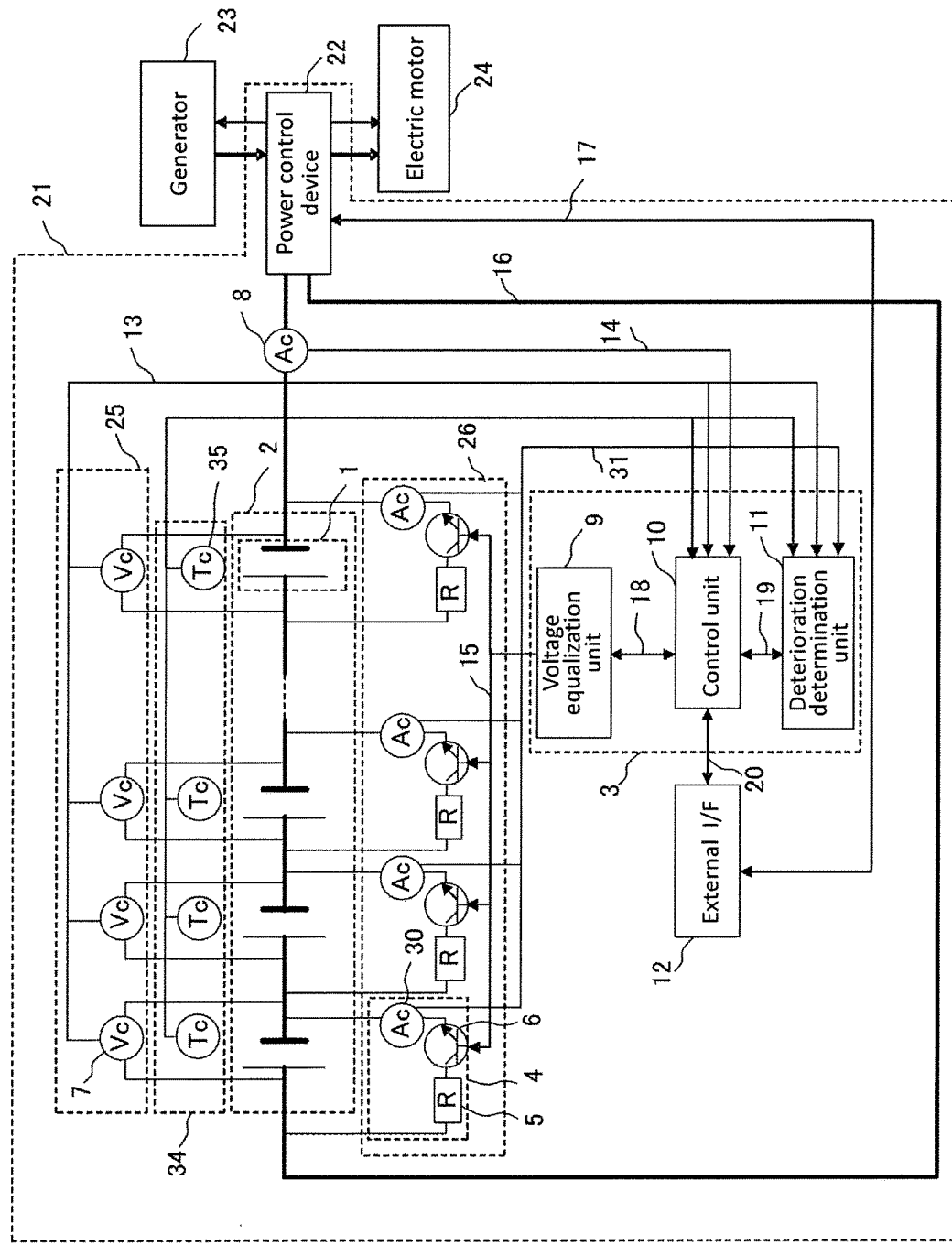
FIG. 16 shows a storage battery deterioration measurement device and a power storage system according to Embodiment 4 of the present invention.

FIG. 16 shows a storage battery deterioration measurement device 3 and a power storage system 21 according to Embodiment 4. In Embodiment 4, explanation will be made under supposition that information on states of the multiple unit batteries 1 is temperatures of the unit batteries 1. The storage battery deterioration measurement device 3 and the power storage system 21 according to Embodiment 4 have a configuration where each of the multiple unit batteries 1 shown in Embodiment 2 includes a balancing circuit 4 and is further provided with the temperature detector 35 shown in Embodiment 3.

The operation of the storage battery deterioration measurement device 3 and the power storage system 21 according to Embodiment 4 is the same as in Embodiments 1 through 3; therefore, the explanation will be omitted.

According to the configuration relating to Embodiment 4, even in a case where deterioration measurement of the unit batteries 1 fails in a state in which the unit batteries 1 are charging or discharging, deterioration measurement based on the balancer current in the balancing circuit 4 can be conducted, enabling more accurate deterioration measurement of the unit batteries 1.

According to the storage battery deterioration measurement device 3 relating to Embodiment 4 of the present invention, the control unit 10 acquires voltages of the multiple unit batteries 1 and temperatures of the multiple unit batteries 1; the deterioration determination unit 11 detects the unit battery 1 indicating the maximum voltage among the voltages of the multiple unit batteries 1 acquired by the control unit 10 and the unit battery 1 indicating the minimum voltage thereamong, and also detects the unit battery 1 indicating the maximum temperature among the temperatures of the multiple unit batteries 1 acquired by the control unit 10 and the unit battery 1 indicating the minimum temperature thereamong; and when the difference between a per-predetermined-period voltage variation of the unit battery 1 indicating the maximum voltage and a per-predetermined-period voltage variation of the unit battery 1 indicating the minimum voltage is larger than a predetermined value and the difference between a per-predetermined-period temperature variation of the unit battery 1 indicating the maximum temperature and a per-predetermined-period temperature variation of the unit battery 1 indicating the minimum temperature is larger than a predetermined value, the deterioration determination unit 11 determines that there exists a deteriorated unit battery 1. Therefore, this can make the time required to measure the deterioration state of the unit batteries 1 shorter than conventional devices and enables more accurate deterioration measurement of the unit batteries 1.

According to the storage battery deterioration measurement device 3 relating to Embodiment 4 of the present invention, in a state in which the multiple unit batteries 1 are discharging and the unit battery 1 indicating the minimum voltage is identical with the unit battery 1 indicating the maximum temperature, the deterioration determination unit 11 determines that the unit battery is deteriorated. Therefore, in a state in which the unit batteries 1 are discharging, the time required to measure the deterioration states of the unit batteries 1 can be shortened than conventional devices and deterioration measurement of the unit batteries 1 can be performed more accurately.

According to the storage battery deterioration measurement device 3 relating to Embodiment 4 of the present invention, in a state in which the multiple unit batteries 1 are charging and the unit battery 1 indicating the maximum voltage is identical with the unit battery 1 indicating the maximum temperature, the deterioration determination unit 11 determines that the unit battery 1 is deteriorated. Therefore, in a state in which the unit batteries 1 are charging, the time required to measure the deterioration states of the unit batteries 1 can be shortened than conventional devices and deterioration measurement of the unit batteries 1 can be performed more accurately.

The power storage system 21 according to Embodiment 4 in the present invention includes the multiple unit batteries 1 connected in series, the storage battery deterioration measurement device 3 to detect the deterioration of the unit batteries 1 described in Embodiment 1 and the power control device 22 to control the power provided from the unit batteries 1; therefore, in a state in which the unit batteries 1, for which to conduct the balancing operation, are discharging or charging, the time required to measure the deterioration states of the unit batteries 1 can be shortened than conventional devices and accurate deterioration measurement of the unit batteries 1 can be performed.

The present invention is not limited to the embodiments described above, and the embodiments can be discretionally combined, appropriately changed, or omitted within the scope of the invention.

DESCRIPTION OF SYMBOLS 1 unit battery
3 storage battery deterioration measurement device
4 balancing circuit
9 voltage equalization unit
10 control unit
11 deterioration determination unit
21 power storage system
22 power control device

The invention claimed is:

1. A storage battery deterioration measurement device comprising:
   a controller to acquire charging or discharging voltages of multiple unit batteries, and
   a deterioration determiner to detect a first unit battery of the multiple unit batteries indicating a maximum voltage among the voltages of the multiple unit batteries acquired by the controller, and a second unit battery of the multiple unit batteries indicating a minimum voltage among the voltages of the multiple unit batteries acquired by the controller, and to determine, when a difference between (i) a first per-predetermined-period voltage variation of the unit battery indicating the maximum voltage, the first per-predetermined-period voltage variation being equal to a difference between voltage of the first unit battery indicated at a first time and voltage of the first unit battery indicated at a second time, and (ii) a second per-predetermined-period voltage variation of the unit battery indicating the minimum voltage, the second per-predetermined-period voltage variation being equal to a difference between voltage of the second unit battery indicated at the first time and voltage of the second unit battery indicated at the second time, is larger than a predetermined value, that there exists a deteriorated unit battery among the multiple unit batteries, and
   wherein, responsive to determining that there exists a deteriorated unit battery among the multiple unit batteries, the controller is configured to modify voltage of at least one of the multiple unit batteries, and
   wherein the controller configures the multiple unit batteries to provide power for a load based on the modified voltage of the at least one of the multiple unit batteries.

2. The storage battery deterioration measurement device according to claim 1, wherein the deterioration determiner determines, when a difference between the first per-predetermined-period voltage variation of the first unit battery indicating the maximum voltage and the second per-predetermined-period voltage variation of the second unit battery indicating the minimum voltage is larger than the predetermined value, that the second unit battery indicating the minimum voltage is deteriorated based on discharging voltages of the multiple unit batteries acquired by the controller.

3. The storage battery deterioration measurement device according to claim 1, wherein the deterioration determiner determines, when a difference between the first per-predetermined-period voltage variation of the first unit battery indicating the maximum voltage and the second per-predetermined-period voltage variation of the second unit battery indicating the minimum voltage is larger than the predetermined value, that the first unit battery indicating the maximum voltage is deteriorated based on charging voltages of the multiple unit batteries acquired by the controller.

4. A power storage system comprising:
   multiple unit batteries connected in series;
   a storage battery deterioration measurement device according to claim 1 to detect deterioration in the unit batteries; and
   a power control device to control power supplied from the unit batteries.

5. A storage battery deterioration measurement device comprising:
   a controller to acquire charging or discharging temperatures of multiple unit batteries, and
   a deterioration determiner to detect a first unit battery of the multiple unit batteries indicating a maximum temperature among the temperatures of the multiple unit batteries acquired by the controller, and a second unit battery of the multiple unit batteries indicating a minimum temperature among the temperatures of the multiple unit batteries acquired by the controller, and to determine, when a difference between (i) a first per-predetermined-period temperature variation of the unit battery indicating the maximum temperature, the first per-predetermined-period temperature variation being equal to a difference between temperature of the first unit battery indicated at a first time and temperature of the first unit battery indicated at a second time, and (ii) a second per-predetermined-period temperature variation of the unit battery indicating the minimum temperature, the second per-predetermined-period temperature variation being equal to a difference between temperature of the second unit battery indicated at the first time and temperature of the second unit battery indicated at the second time, is larger than a predetermined value, that the unit battery indicating the maximum temperature is deteriorated among the multiple unit batteries, and
   wherein, responsive to determining that there exists a deteriorated unit battery among the multiple unit batteries, the controller is configured to modify voltage of at least one of the multiple unit batteries, and
   wherein the controller configures the multiple unit batteries to provide power for a load based on the modified voltage of the at least one of the multiple unit batteries.

* * * * *